United States Patent
O et al.

(10) Patent No.: US 11,169,711 B2
(45) Date of Patent: Nov. 9, 2021

(54) MEMORY MODULE, MEMORY DEVICE, AND PROCESSING DEVICE HAVING A PROCESSOR MODE, AND MEMORY SYSTEM

(71) Applicant: Samsung Electronics Co., Ltd., Suwon-si (KR)

(72) Inventors: Seong-Il O, Suwon-si (KR); Nam Sung Kim, Champaign, IL (US); Young-Hoon Son, Suwon-si (KR); Chan-Kyung Kim, Hwaseong-si (KR); Ho-Young Song, Hwaseong-si (KR); Jung Ho Ahn, Seoul (KR); Sang-Joon Hwang, Suwon-si (KR)

(73) Assignees: SAMSUNG ELECTRONICS CO., LTD., Suwon-si (KR); SNU R&D FOUNDATION, Seoul (KR); WISCONSIN ALUMNI RESEARCH FOUNDATION, Madison, WI (US)

( * ) Notice: Subject to any disclaimer, the term of this patent is extended or adjusted under 35 U.S.C. 154(b) by 161 days.

(21) Appl. No.: 16/524,749

(22) Filed: Jul. 29, 2019

(65) Prior Publication Data
US 2019/0354292 A1    Nov. 21, 2019

Related U.S. Application Data

(62) Division of application No. 15/603,255, filed on May 23, 2017, now Pat. No. 10,416,896.

(60) Provisional application No. 62/408,510, filed on Oct. 14, 2016.

(51) Int. Cl.
*G06F 12/00* (2006.01)
*G06F 3/06* (2006.01)
*G06F 13/16* (2006.01)

(52) U.S. Cl.
CPC .......... *G06F 3/0611* (2013.01); *G06F 3/0656* (2013.01); *G06F 3/0659* (2013.01); *G06F 3/0683* (2013.01); *G06F 13/1673* (2013.01)

(58) Field of Classification Search
CPC .... G06F 3/0611; G06F 3/0659; G06F 3/0656; G06F 3/0683; G06F 13/1673
See application file for complete search history.

(56) References Cited

U.S. PATENT DOCUMENTS

| | | |
|---|---|---|
| 6,785,780 B1 | 8/2004 | Klein et al. |
| 2004/0148482 A1 | 7/2004 | Grundy et al. |
| 2005/0146943 A1 | 7/2005 | Jeddeloh |
| 2014/0040532 A1 | 2/2014 | Watanabe et al. |

*Primary Examiner* — Gurtej Bansal
(74) *Attorney, Agent, or Firm* — Muir Patent Law, PLLC

(57) ABSTRACT

A memory module includes a memory device, a command/address buffering device, and a processing data buffer. The memory device includes a memory cell array, a first set of input/output terminals, each terminal configured to receive first command/address bits, and a second set of input/output terminals, each terminal configured to receive both data bits and second command/address bits. The command/address buffering device is configured to output the first command/address bits to the first set of input/output terminals. The processing data buffer is configured to output the data bits and second command/address bits to the second set of input/output terminals. The memory device is configured such that the first command/address bits, second command/address bits, and data bits are all used to access the memory cell array.

9 Claims, 25 Drawing Sheets

MEMORY MODULE, MEMORY DEVICE, AND PROCESSING DEVICE HAVING A PROCESSOR MODE, AND MEMORY SYSTEM

CROSS-REFERENCE TO RELATED APPLICATIONS

This U.S. non-provisional application is a divisional application of U.S. non-provisional application Ser. No. 15/603,255, filed May 23, 2017, which claims the benefit of priority under 35 U.S.C. § 119 to U.S. Provisional Application No. 62/408,510 filed on Oct. 14, 2016 in the USPTO, the entire contents of each of which are incorporated by reference herein in their entireties.

This invention was made with government support under CNS1217102 awarded by the National Science Foundation and HR0011-12-2-0019 awarded by the DOD/DARPA. The government has certain rights in the invention.

BACKGROUND

1. Technical Field

Example embodiments of the present inventive concepts relate to semiconductor memory devices, and more particularly to memory modules having processor modes and memory systems including the memory modules.

2. Description of the Related Art

In a conventional computing system architecture, instructions (or programs) and data are stored in a memory device spaced apart from a host processor, and the instructions and the data should be transferred from the memory device to the host processor to perform data processing on the data based on the instructions. Thus, although a processing speed of the host processor has been increased, a data transfer rate between the memory device and the host processor may serve as a bottleneck for the performance improvement, and thus a throughput of the computing system may be limited. To address this issue, a processing-in-memory (PIM) device where processor logic is tightly coupled to memory cells has been developed. This PIM device may improve a data processing speed and a data transfer rate.

SUMMARY

Some example embodiments provide a memory module that can be compatible with a memory module standard and can be implemented in a processing-in-memory architecture without structurally changing a memory device.

Some example embodiments provide a memory system including the memory module.

In some embodiments, a memory module includes a memory device, a command/address buffering device, and a processing data buffer. The memory device includes a memory cell array, a first set of input/output terminals, each terminal configured to receive first command/address bits, and a second set of input/output terminals, each terminal configured to receive both data bits and second command/address bits. The command/address buffering device is configured to output the first command/address bits to the first set of input/output terminals. The processing data buffer is configured to output the data bits and second command/address bits to the second set of input/output terminals. The memory device is configured such that the first command/address bits, second command/address bits, and data bits are all used to access the memory cell array.

In some embodiments, a memory module includes a plurality of memory devices, a command/address buffering device, and a plurality of processing data buffers. Each of the plurality of memory devices includes a memory cell array, a first set of input/output terminals, each terminal configured to receive first command/address bits, and a second set of input/output terminals, each terminal configured to receive data bits. The command/address buffering device is configured to output the first command/address bits to the first set of input/output terminals. Each of the plurality of processing data buffers is configured to switch between acting as a data buffer for a respective memory device and acting as a processor for performing processing operations on data received from the respective memory device.

In some embodiments, a processing data buffer for a memory module includes a data buffer portion, a processor portion, a selection circuit connected to the data buffer portion and the processor portion and configured to select between the data buffer portion and the processor portion, a plurality of first input/output lines connected between the selection circuit and the data buffer portion, a plurality of second input/output lines connected between the selection circuit and the processor portion, a first set of input/output terminals connected to the data buffer portion and for communicating to the outside of the processing data buffer, and a second set of input/output terminals connected to the selection circuit and for communicating to the outside of the processing data buffer.

In some embodiments, a non-volatile dual in-line memory module (NVDIMM) formed on a module board, includes a plurality of DRAM memory devices, a plurality of nonvolatile memory devices connected to the plurality of DRAM memory devices, an NVDIMM controller, and a plurality of processing data buffers connected to the plurality of DRAM memory devices respectively. The plurality of DRAM memory devices each include a memory cell array, a first set of input/output terminals, each terminal configured to receive first command/address bits, and a second set of input/output terminals, each terminal configured to receive first data bits. The plurality of nonvolatile memory devices each include a memory cell array, a third set of input/output terminals, each terminal configured to receive second command/address bits, and a fourth set of input/output terminals, each terminal configured to receive second data bits. The NVDIMM controller is configured to output the first command/address bits to the first set of input/output terminals and to output the second command/address bits to the third set of input/output terminals. Each of the plurality of processing data buffers is configured to switch between acting as a data buffer for its respective memory device and acting as a processor for performing processing operations on data received from its respective memory device.

In some embodiments, a method of performing near data processing includes sending a processor mode entry command to a memory module instructing processing data buffers of the memory module to operate in processor mode, and sending a processor mode exit command to the memory module instructing the processing data buffers of the memory module to end operating in the processor mode and to operate in data buffer mode.

In some embodiments, a method of performing near data processing includes receiving a first mode command at a processing data buffer of a memory module, the first mode command instructing the processing data buffer to operate in processor mode, while operating in the processor mode, transmitting, from the processing data buffer, command and address information to a memory device to which the processing data buffer is connected, receiving a second mode command at the processing data buffer, the second mode command instructing the processing data buffer to operate as a data buffer for the memory device, and while operating in the data buffer mode, transmitting, from the processing data buffer, data to the memory device.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1A:
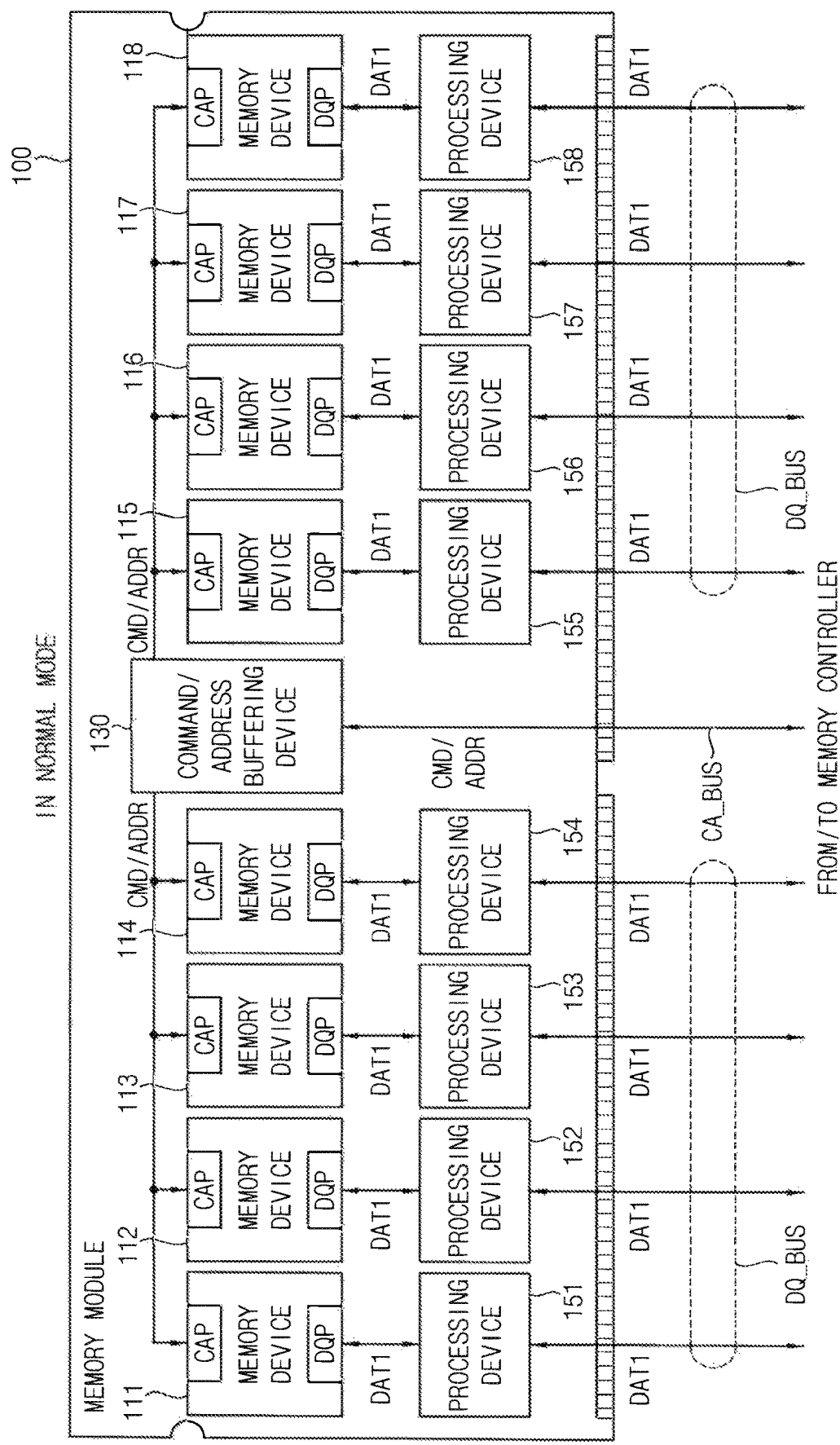
FIG. 1A is a block diagram illustrating a memory module in a normal mode according to example embodiments.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 1B:
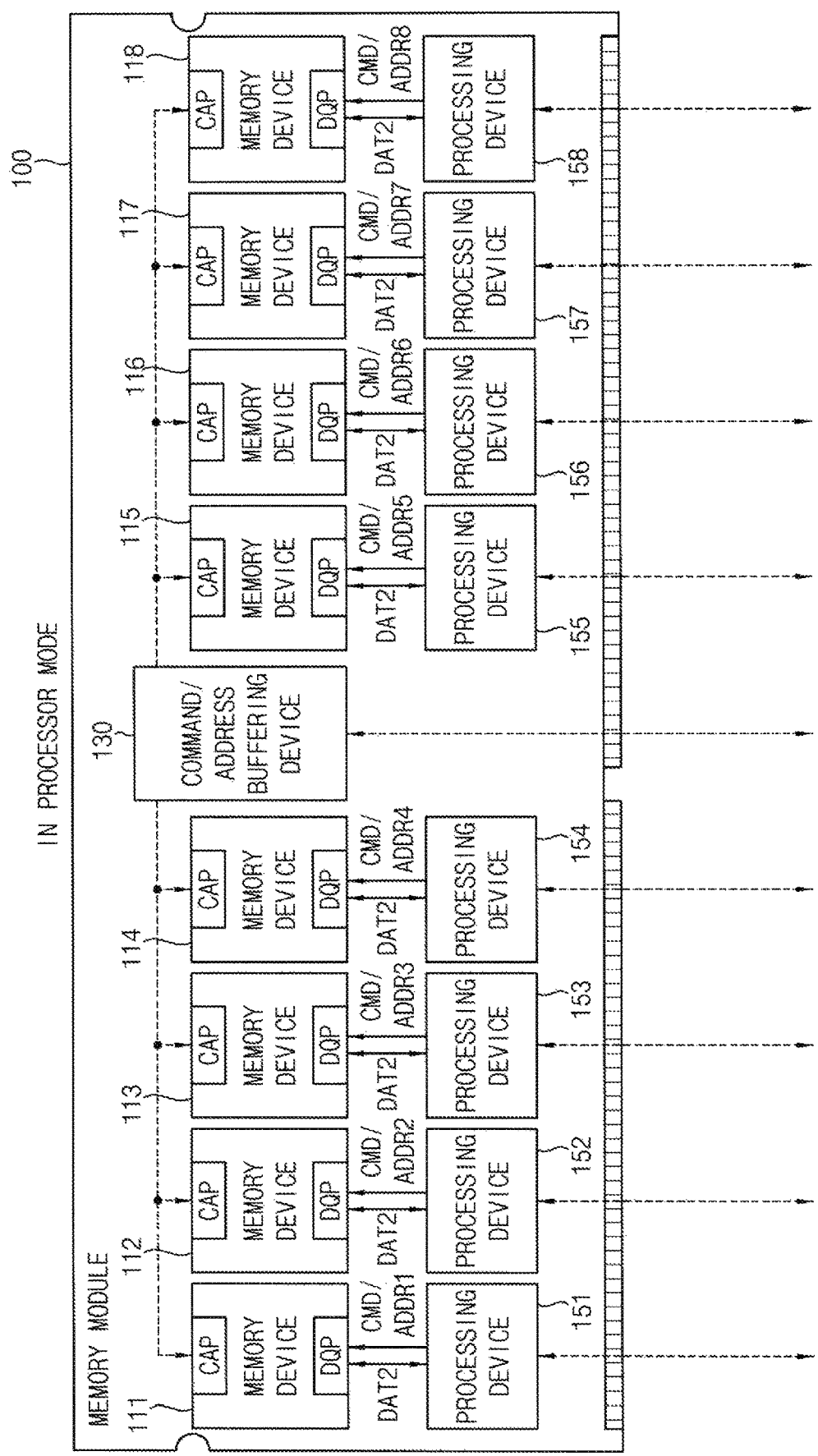
FIG. 1B is a block diagram illustrating a memory module in a processor mode according to example embodiments.

FIG. 1A is a block diagram illustrating a memory module in a normal mode according to example embodiments, and FIG. 1B is a block diagram illustrating a memory module in a processor mode according to example embodiments.

Referring to FIGS. 1A and 1B, a memory module 100 includes a plurality of memory devices 111 through 118 each having command/address pins CAP and data pins DQP, a command/address buffering device 130 connected to the command/address pins CAP of the memory devices 111 through 118, and a plurality of processing devices 151 through 158 each connected to the data pins DQP of a corresponding one of the memory devices 111 through 118. The command/address buffering device 130 is connected through a command/address bus CA_BUS to a memory controller, and the processing devices 151 through 158 are connected through a data bus DQ_BUS to the memory controller.

The command/address pins CAP may be generally referred to as a set of input/output terminals, and the data pins DQP may be generally referred to as a set of input/output terminals. In some embodiments, the different sets of input/output terminals may be referred to as first, second, or third sets of input/output terminals. These input/output terminals are for sending and/or receiving signals to between the memory devices 111-118 and devices external to the memory devices 111-118. The command/address input/output terminals CAP may be a first set of input/output terminals configured, among other things, to receive first command/address bits (e.g., command and/or address bits). Thus, the command/address input/output terminals CAP may be connected to communicate command and/or address signals between circuitry in the command/address buffering device 130 and circuitry for processing commands/addresses in a corresponding memory device. The data input/output terminals DQP may be a second set of input/output terminals configured, among other things, to receive both data bits and second command/address bits. Thus, the data input/output terminals DQP may be connected to communicate both data and command/address signals between circuitry in a corresponding processing device and circuitry in the corresponding memory device. These features will be described further below.

In a normal mode, as illustrated in FIG. 1A, in response to a command/address signal CMD/ADDR received from the memory controller, the memory module 100 may write data DAT1 received from the memory controller into the memory devices 111 through 118, or may read data DAT1 from the memory devices 111 through 118.

For example, in the normal mode, the command/address buffering device 130 may receive the command/address signal CMD/ADDR from the memory controller through the command/address bus CA_BUS, may buffer the received command/address signal CMD/ADDR, and may output and provide the same buffered command/address signal CMD/ADDR to the command/address pins CAP of the memory devices 111 through 118. By buffering the command/address signal CMD/ADDR, the command/address buffering device 130 may improve signal integrity of the command/address signal CMD/ADDR, and may reduce a load experienced by the memory controller with respect to the command/address signal CMD/ADDR. The command/address buffering device 130 may be referred to as a "registering clock driver (RCD)," or simply a command/address buffer. In some example embodiments, the command/address buffering device 130 may be the registering clock driver in compliance with a memory module standard, such as a double data rate 4 load-reduced dual in-line memory module (DDR4 LRDIMM) standard.

In a case where the command/address signal CMD/ADDR indicates a write command, the processing devices 151 through 158, also referred to herein as processing data buffers, may receive data DAT1 (e.g., data bits) through the data bus DQ_BUS from the memory controller, may buffer the received data DAT1, and may output and provide the data DAT1 to the data pins DQP of the memory devices 111 through 118 to write the data DAT1 to the memory devices 111 through 118. Since the memory devices 111 through 118 receive the same command/address signal CMD/ADDR in the normal mode, the data DAT1 may be written at the same address or the same location of the respective memory devices 111 through 118. In certain embodiments, the processing devices (e.g., processing data buffers) 151-158 described herein may be semiconductor chips (e.g., dies formed from a wafer), or semiconductor packages (e.g., one or more dies packaged on a package substrate and encapsulated by an encapsulant). Similarly, in some embodiments, the memory devices 111 through 118 described herein may be semiconductor chips or semiconductor packages.

In a case where the command/address signal CMD/ADDR indicates a read command, the processing devices 151 through 158 may receive, through the data pins DQP, data DAT1 read from the memory devices 111 through 118, may buffer the received data DAT1, and may provide the data DAT1 to the memory controller through the data bus DQ_BUS. Since the memory devices 111 through 118 receive the same command/address signal CMD/ADDR in the normal mode, the data DAT1 at the same address or the same location of the respective memory devices 111 through 118 may be read, for example, at the same time.

As described above, in the normal mode, the processing devices 151 through 158 may operate as data buffers that buffer the data DAT1 transferred between the memory controller and the memory devices 111 through 118. In some example embodiments, the processing devices 151 through 158 may operate as the data buffers in compliance with the memory module standard, such as the DDR4 LRDIMM standard. Since the processing devices 151 through 158 operate as the data buffers, signal integrity of the data DAT1 may be improved, and a load experienced by the memory controller with respect to the data DAT1 may be reduced.

Further, as described above, the memory module 100 according to example embodiments may include the command/address buffering device 130 in compliance with the memory module standard and the processing devices 151 through 158 operating as the data buffers in compliance with the memory module standard. Accordingly, the memory module 100 according to example embodiments may be connected to a memory channel in compliance with the memory module standard, and may operate, in the normal mode, as a normal memory module (e.g., a DDR4 LRDIMM) in compliance with the memory module standard.

Figure 2A:
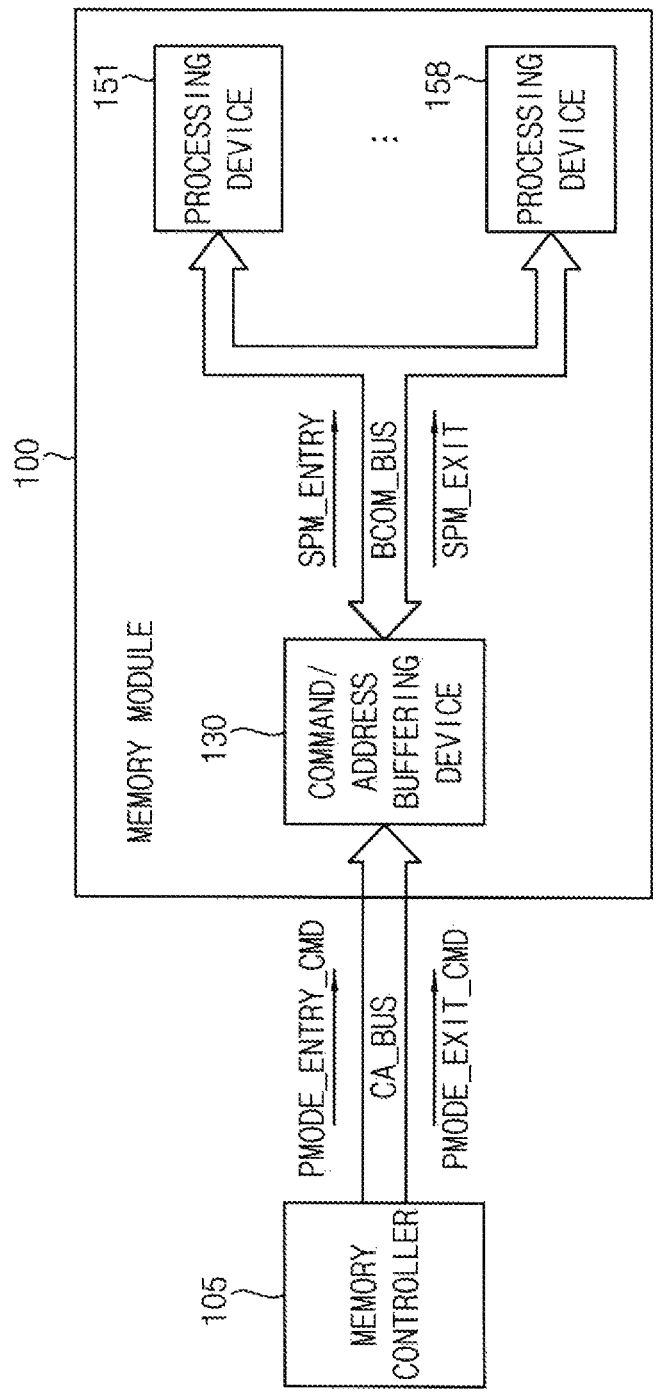
FIG. 2A is a diagram for describing an example of notifying entry and exit of a processor mode to a plurality of processing devices included in a memory mode.
Figure 2B:
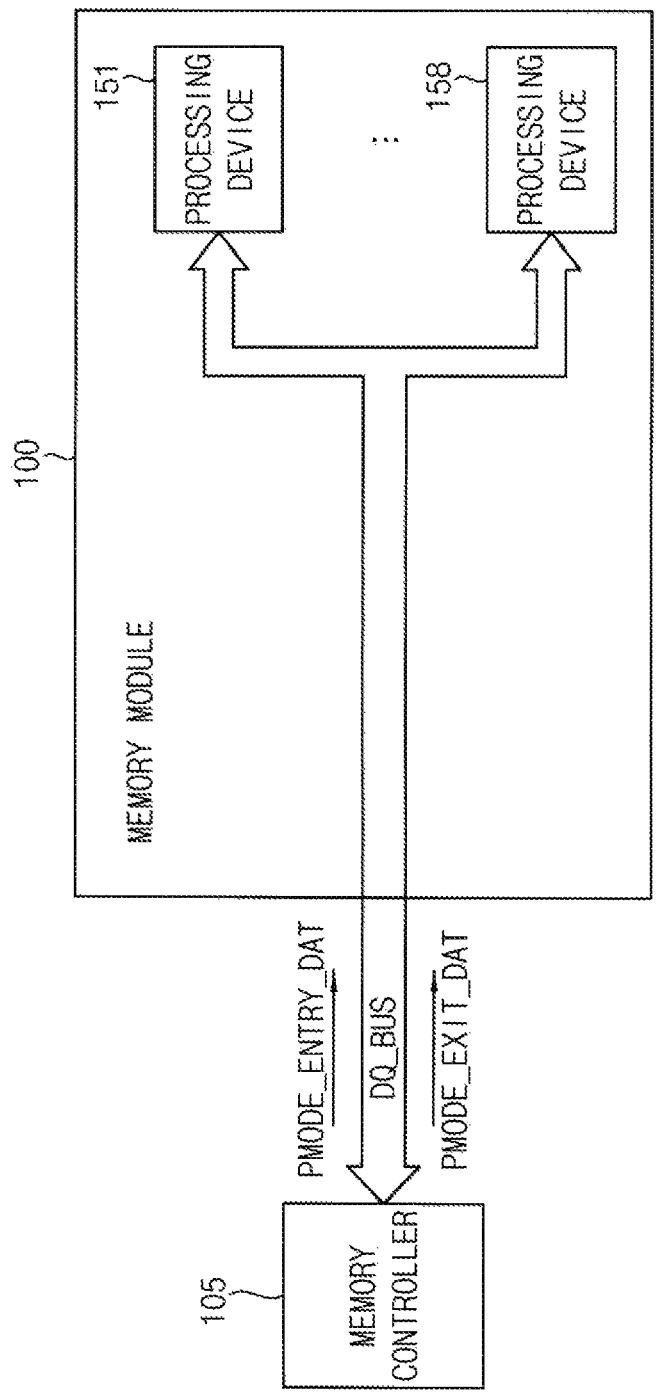
FIG. 2B is a diagram for describing another example of notifying entry and exit of a processor mode to a plurality of processing devices included in a memory mode.

The memory module 100 may be instructed to enter a processor mode by the memory controller (for example, through the command/address bus CA_BUS as illustrated in FIG. 2A, through the data bus DQ_BUS as illustrated in FIG. 2B, or through another control line—see also FIGS. 8, 8A, and 13, described further below), and may operate in the processor mode. In the processor mode, as illustrated in FIG. 1B, the memory module 100 may perform data processing on the data DAT2 stored in the memory devices 111 through 118. For example, in the processor mode, each processing device (e.g., 151) may perform data processing on the data DAT2 stored in a memory device (e.g., 111) that is directly connected to the corresponding processing device (e.g., 151). The data processing performed by the processing devices 151 through 158 may be any data processing including an arithmetic operation and/or a logical operation. For example, the data processing may include graphic data processing, in-memory database data processing, real-time analysis data processing, etc. The results of the data processing may be sent back to the memory controller, e.g., through the data bus DQ_BUS, or may be stored in the memory device(s). As described above, in certain embodiments, a set of input/output terminals (e.g., DQP pins) is configured to serve as data terminals during a normal operation mode of the memory module 100 so that a processing device or multiple processing devices operate as a data buffer, and to serve as command and address terminals during a processor operation mode of the memory module so that the processing device or multiple processing devices perform arithmetic and/or logical operations on data stored in a corresponding memory device or memory devices. In this manner, the processing devices are each configured to switch between acting as a data buffer for a respective memory device and acting as a processor for performing processing operations on data received from the respective memory device. Normal operation mode may also be described herein as data buffer mode.

Further, in the processor mode, the processing devices 151 through 158 may perform the data processing in parallel, and the memory devices 111 through 118 may perform data read operations and/or data write operations independently of each other. For example, in the processor mode, the data DAT2 may be read or written at different addresses or different relative locations of the memory devices 111 through 118. To access the data DAT2 at the different addresses of the memory devices 111 through 118, the plurality of processing devices 151 through 158 may generate a plurality of different command/address signals CMD/ADDR1 through CMD/ADDR8, respectively, and may provide the plurality of command/address signals CMD/ADDR1 through CMD/ADDR8 to the plurality of memory devices 111 through 118, respectively.

In the example embodiments illustrated in FIG. 1B, each processing device (e.g., 151) may provide the command/address signal (e.g., CMD/ADDR1) generated by the processing device (e.g., 151) to a corresponding memory device (e.g., 111) connected to the processing device (e.g., 151) through the data pins DQP of the memory device (e.g., 111). In some embodiments, the command/address signal (CMD/ADDR1) may be generated by the processing device (e.g., 151), which may be pre-programmed to generate certain command/address signals upon receiving a processor mode entry signal. For example, a processor mode entry signal may be received from a memory controller, in one embodiment, directly to the processing device through the DQ_BUS (see further description in connection with FIGS. 2B and 8). In response, the processing device 151 may enter a processor mode in which one or more pre-programmed commands/address signals CMD/ADDR1 are transmitted to the corresponding memory device 111. Alternatively, a memory controller may transmit a signal that includes both a processor mode entry command and an additional command/address signal that the processing device 151 then can send to the corresponding memory device 111.

In another embodiment, as described further below in connection with FIGS. 2A, 8A, and 13, a processor mode entry signal, or processor mode entry signal with an additional command/address signal, may be received from a memory controller at a command/address buffering device 130, and the signal may then be forwarded/transmitted from the command/address buffering device 130 directly to the processing device 151, for example, through a control bus (BCOM_BUS). In some example embodiments, each processing device (e.g., 151) may transmit/receive the data DAT2 or transmit the command/address signal (e.g., CMD/ADDR1) to the corresponding memory device (e.g., 111) through the data pins DQP in a time-divisional manner (or a temporally multiplexed manner). For example, each processing device (e.g., 151) may use the data pins DQP as pins for transmitting the command/address signal (e.g., CMD/ADDR1) during a time period, and may use the data pins DQP as pins for transmitting/receiving the data DAT2 during another time period, both time periods being part of the processor mode. In other example embodiments, each processing device (e.g., 151) may transmit/receive the data DAT2 or transmit the command/address signal (e.g., CMD/ADDR1) to the corresponding memory device (e.g., 111) through the data pins DQP in a space-divisional manner (or a spatially multiplexed manner). For example, each processing device (e.g., 151) may use a portion of the data pins DQP as pins for transmitting the command/address signal (e.g., CMD/ADDR1), and may use the remaining portion of the data pins DQP as pins for transmitting/receiving the data DAT2. This will be described in further detail later. Thus, during processor mode, both data and command/address signals can be sent between the memory devices 111-118 and corresponding processing devices 151-158 as part of a data processing operation performed by the processing devices 151-158.

As such, a processing data buffer (e.g., each of processing devices 151-158) as discussed above in connection with FIGS. 1A and 1B is configured to output both data bits and command/address bits to the set of input/output terminals DQP of corresponding memory devices, and may further receive data bits from the corresponding memory devices. In this manner, each memory device is configured such that first command/address bits (e.g., received from CAP pins during a normal operation), second command/address bits (e.g., received from DQP pins during a processor operation), and data bits (e.g., received from DQP pins in either operation) are all used to access the memory cell array.

Unlike a normal memory module connected to a memory channel in compliance with a memory module standard, a conventional memory module including a processing-in-memory (PIM) device is connected to a memory module in a point-to-point (P-to-P) manner. Thus, to increase a capacity of a data storage space in a computing system including the conventional memory module including the PIM device, not only the number of the memory modules but also the number of memory controllers and the number of the memory channels should be increased. However, since the processing devices 151 through 158 operate as the data buffers in compliance with the memory module standard, the memory module 100 according to example embodiments may be connected to the memory channel in compliance with the memory module standard, and may operate, in the normal mode, as the normal memory module in compliance with the memory module standard. Accordingly, in a computing system including the memory module 100 according to example embodiments, the capacity of the data storage space can be readily increased by increasing only the number of memory modules 100 connected to the memory channel.

Further, the conventional PIM device is implemented by integrating processor logic and memory on the same die or by stacking a processor logic die on a memory die. Accordingly, the conventional PIM device including processor logic suitable for a particular application cannot be applied to another application, and thus the conventional PIM device is not suitable for mass production. However, the memory module 100 according to example embodiments may be implemented in a processing-in-memory (PIM) architecture (which may be referred to as a near-data-processing (NDP) architecture) without structurally changing the memory device 111 through 118 in relation to the layout of the memory module 100. Accordingly, the memory device 111 through 118 and the memory module 100 can be widely employed in various applications, and can be mass-produced.

In addition, in the memory module 100 according to example embodiments, the processing devices 151 through 158 may perform parallel data processing on the data DAT2 stored in the memory devices 111 through 118 directly connected to the processing devices 151 through 158, thereby improving the data processing speed and the data throughput of a computing system including the memory module 100.

Although FIGS. 1A and 1B illustrate an example where the memory module 100 includes eight memory devices 111 through 118, according to example embodiments, the memory module 100 may include any number of the memory devices. For example, the memory module 100 may include from four to thirty-six memory devices. In an example embodiment of a computing system employing a 64-bit data word, the memory module 100 may include nine memory devices including eight memory devices 111 through 118 each for storing 8 bits of the data word and one memory device for storing an 8-bit error correction code (ECC).

Further, in one embodiment, FIGS. 1A and 1B illustrate an example where the memory module 100 includes one memory rank including eight memory devices 111 through 118. However, according to example embodiments, the memory module 100 may include any number of memory ranks, for example up to four memory ranks. In this case, each processing device (e.g., 151) may be directly connected to from one to four memory devices (e.g., 111).

Each processing device (e.g., 151) and the corresponding memory device (e.g., 111) may be implemented as separate integrated circuits (e.g., separate chips) or separate packages. Alternatively, in some example embodiments, each processing device (e.g., 151) and the corresponding memory device (e.g., 111) may be implemented or integrated as a single integrated circuit (e.g., chip) or a single package (e.g., such that external DQP pins receive the signals for both the processing device and the memory device, and a separate channel within the chip or package transfers signals between the processing device and the memory device).

Figure 3A:
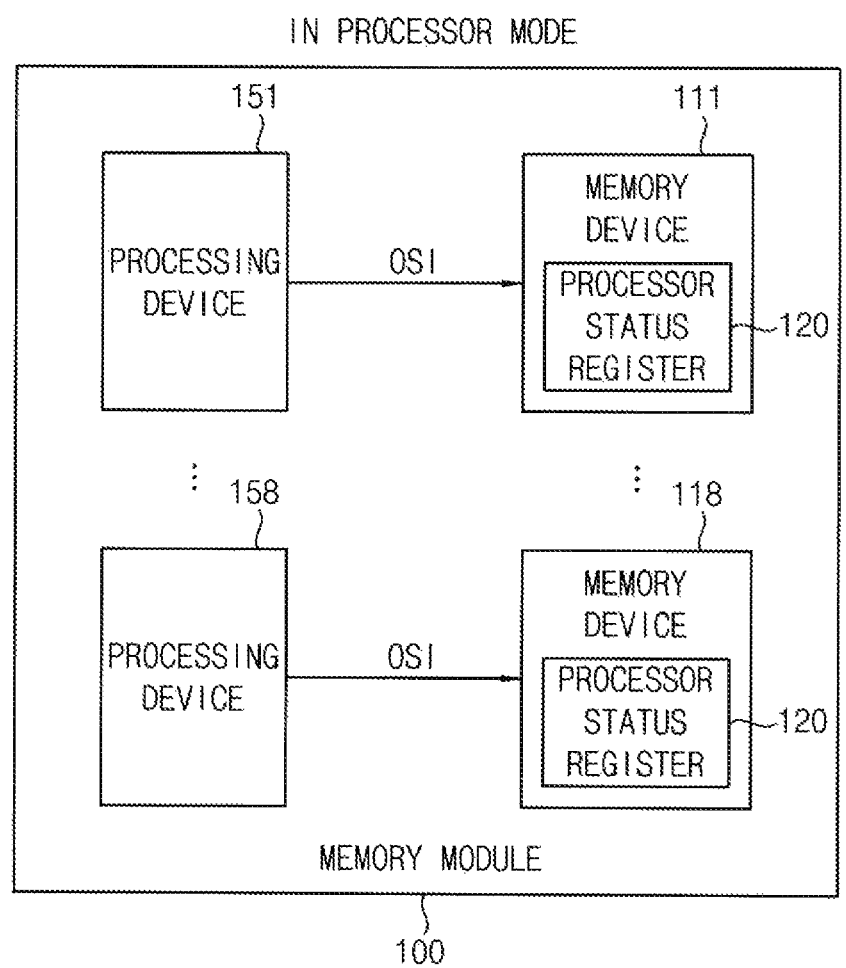
FIG. 3A is a diagram for describing an example where a plurality of processing devices included in a memory mode write operation status information into processor status registers.
Figure 3B:
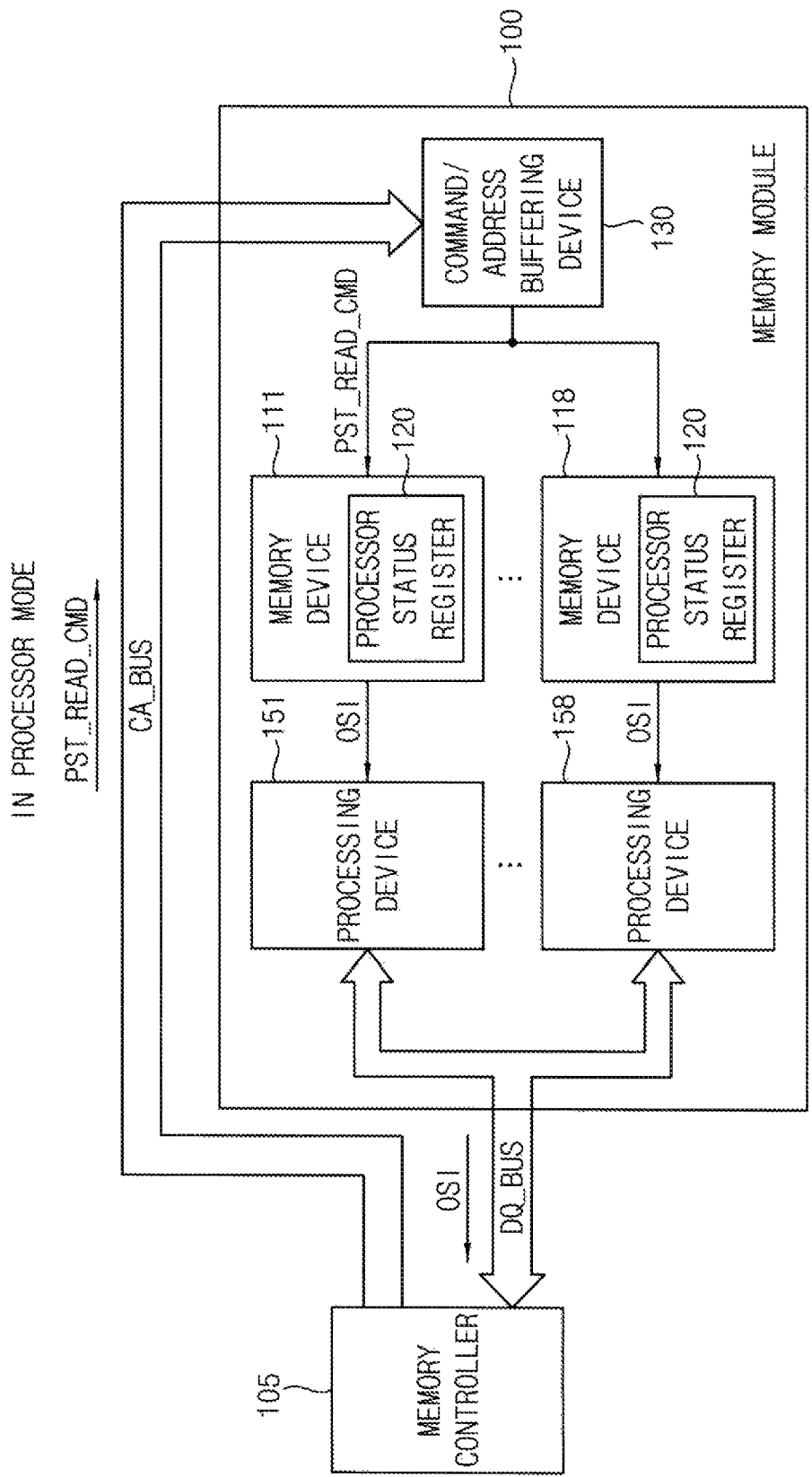
FIG. 3B is a diagram for describing an example where a memory controller reads operation status information stored in processor status registers.

FIG. 2A is a diagram for describing an example of notifying entry and exit of a processor mode to a plurality of processing devices included in a memory module, FIG. 2B is a diagram for describing another example of notifying entry and exit of a processor mode to a plurality of processing devices included in a memory module, FIG. 3A is a diagram for describing an example where a plurality of processing devices included in a memory module write operation status information into processor status registers, and FIG. 3B is a diagram for describing an example where a memory controller reads operation status information stored in processor status registers.

Referring to FIG. 2A, in some example embodiments, a memory module 100 may be instructed to enter a processor mode by a memory controller 105 through a command/address bus CA_BUS. In one embodiment, the command/address bus CA_BUS may be a bus configured to transfer bits received form a memory controller to the command/address buffering device 130. For example, the memory controller 105 may transfer, as a command/address signal, a processor mode entry command PMODE_ENTRY_CMD indicating an entry into a processor mode through the command/address bus CA_BUS. A command/address buffering device 130 may transfer a processor mode entry signal SPM_ENTRY to processing devices 151 through 158 through a control bus BCOM_BUS between the command/address buffering device 130 and the processing devices 151 through 158 in response to the processor mode entry command PMODE_ENTRY_CMD, and the processing devices 151 through 158 may operate in the processor mode in response to the processor mode entry signal SPM_ENTRY. An example of the control bus BCOM_BUS can be seen also in FIG. 13 in connection with the memory module, and in FIG. 8A in connection with a processing device. In some example embodiments, the control bus BCOM_BUS between the command/address buffering device 130 and the processing devices 151 through 158 may be a buffer communication (BCOM) bus (e.g., having a bit width of 4 bits) for transferring a buffer control command and status information. The BCOM bus (shown in FIG. 2A but not shown in FIG. 1A or 1B) may be directly connected to both the command/address buffering device 130 and the processing devices 151 through 158 and may be an additional bus to those shown in FIGS. 1A and 1B (see, e.g., FIG. 13).

Referring to FIG. 2B, in other example embodiments, the memory module 100 may be instructed to enter the processor mode by the memory controller 105 through a data bus DQ_BUS. In one embodiment, the data bus DQ_BUS may be a bus configured to transfer bits received form a memory controller to the processing data buffer, or a plurality of processing data buffers. For example, the memory controller 105 may transfer processor mode entry data PMODE_ENTRY_DAT as part of a processor mode entry command, indicating an entry into the processor mode through the data bus DQ_BUS. The processing devices 151 through 158 may operate in the processor mode in response to the processor mode entry data PMODE_ENTRY_DAT. Later, a subsequent mode command, such as a processor mode exit command, may be transmitted from the memory controller 105 through data bus DQ_BUS (in one example) to the processing devices 151 through 158. The processor mode exit command may instruct the processing devices 151 through 158 to stop operating as processing devices and re-enter operating in a data buffer mode.

In still other example embodiments, the memory module 100 may receive a processor mode entry signal from the memory controller 105 through a control line other than lines of the command/address bus CA_BUS and lines of the data bus DQ_BUS, and may operate in the processor mode in response to the processor mode entry signal.

In some example embodiments, once the memory module 100 operates in the processor mode, the memory controller 105 may check an operation status of the memory module 100, for example operation statuses of the processing devices 151 through 158 included in the memory module 100.

As illustrated in FIG. 3A, each memory device 111 through 118 may include a processor status register 120 as one of mode registers, and each processing device (e.g., 151) may provide operation status information OSI to the processor status register 120 included in a corresponding memory device (e.g., 111) in the processor mode. For example, to store the operation status information OSI in the processor status register 120, each processing device (e.g., 151) may transfer, as a command/address signal (e.g., CMD/ADDR1 in FIG. 1B), a command that writes the operation status information OSI to the processor status register 120 to the corresponding memory device (e.g., 111).

As illustrated in FIG. 3B, the memory controller 105 may (e.g., periodically) receive the operation status information OSI of the processing devices 151 through 158 in the processor mode. For example, in the processor mode, the memory devices 111 through 118 may receive a processor status read command PST_READ_CMD from the memory controller 105 through the command/address bus CA_BUS and the command/address buffering device 130, and may transfer the operation status information OSI stored in the processor status register 120 to the memory controller 105 through the processing devices 151 through 158 and the data bus DQ_BUS in response to the processor status read command PST_READ_CMD. In some example embodiments, while the memory controller 105 receives the operation status information OSI, the processing devices 151 through 158 may stop performing data processing, and may operate as data buffers. Although FIGS. 3A and 3B illustrate an example where the operation status information OSI of the processing devices 151 through 158 is stored in the processor status register 120 of the memory devices 111 through 118, in other example embodiments, the processing devices 151 through 158 may provide the operation status information OSI to the command/address buffering device 130 through the control bus BCOM_BUS, and the command/address buffering device 130 may store the operation status information OSI of the processing devices 151 through 158.

When the memory controller 105 determines, based on the received operation status information OSI, that the processing devices 151 through 158 have completed the data processing, or when the memory controller 105 determines that it is required for the memory module 100 to operate in a normal mode, the memory controller 105 may instruct the memory module 100 to exit the processor mode. In some example embodiments, as illustrated in FIG. 2A, the memory controller 105 may transfer a processor mode exit command PMODE_EXIT_CMD through the command/address bus CA_BUS, the command/address buffering device 130 may transfer a processor mode exit signal SPM_EXIT to the processing devices 151 through 158 through the control bus BCOM_BUS in response to the processor mode exit command PMODE_EXIT_CMD, and the processing devices 151 through 158 may operate in the normal mode in response to the processor mode exit signal SPM_EXIT. In other example embodiments, as illustrated in FIG. 2B, the memory controller 105 may transfer processor mode exit data PMODE_EXIT_DAT through the data bus DQ_BUS, and the processing devices 151 through 158 may operate in the normal mode in response to the processor mode exit data PMODE_EXIT_DAT. In still other example embodiments, the memory module 100 may receive a processor mode exit signal from the memory controller 105 through a control line other than lines of the command/address bus CA_BUS and lines of the data bus DQ_BUS, and may operate in the normal mode in response to the processor mode exit signal.

Figure 4:
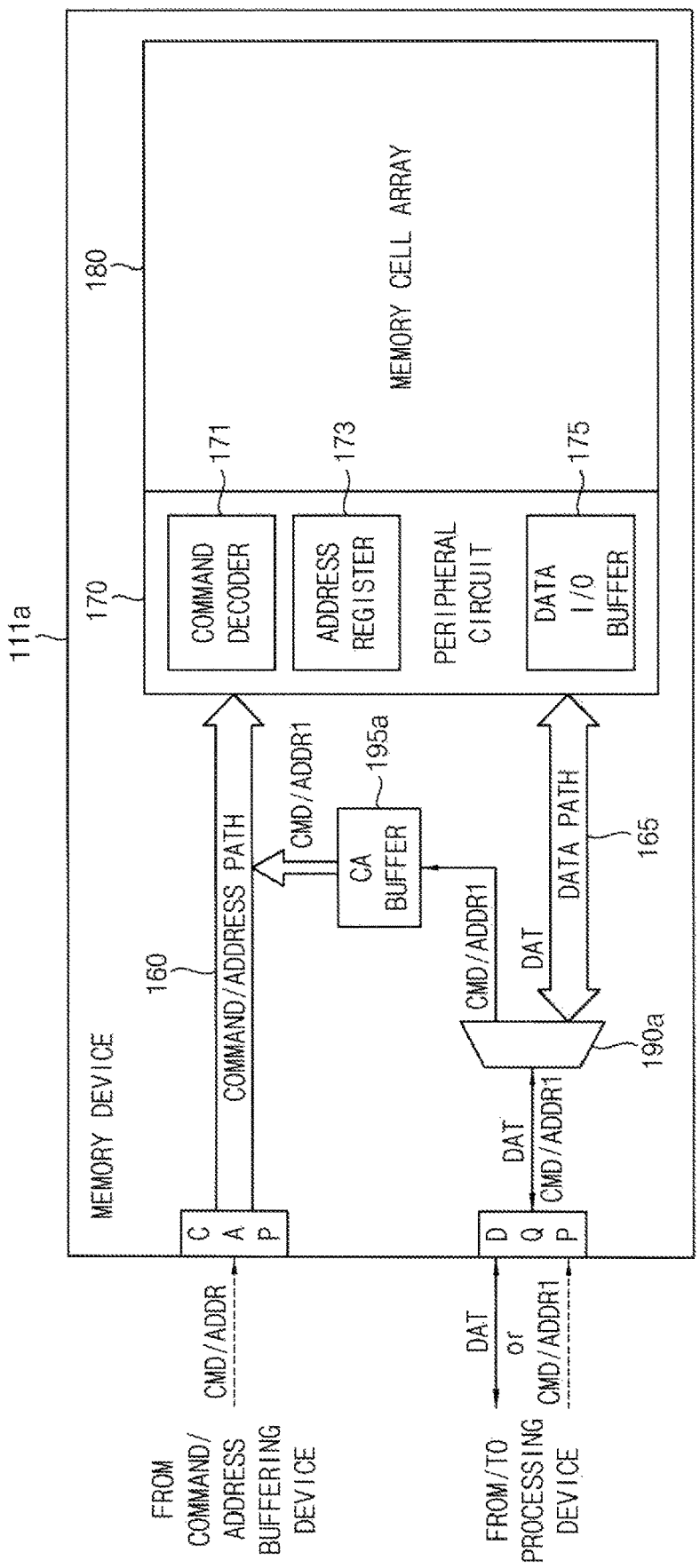
FIG. 4 is a block diagram illustrating an example of each memory device included in a memory module according to example embodiments.

FIG. 4 is a block diagram illustrating an example of each memory device included in a memory module according to example embodiments.

Referring to FIG. 4, a memory device 111*a* (e.g., each memory device 111 through 118 illustrated in FIGS. 1A and 1B) may include command/address pins CAP (e.g., a first set of input/output terminals), a command/address path 160 (also described as a channel, or described as lines) for connecting the command/address pins CAP and a peripheral circuit 170, data pins DQP (e.g., a second set of input/output terminals), a data path 165 (also described as a channel, or described as lines) for connecting the data pins DQP and the peripheral circuit 170, the peripheral circuit 170, a memory cell array 180 and a path selecting unit 190*a*.

The memory cell array 180 may include a plurality of memory cells for storing data. In some example embodiments, the memory cells may be dynamic random access memory (DRAM) cells, and the memory device 111*a* may be a DRAM device. In other example embodiments, the memory device 111*a* may be a volatile memory device, such as a static random access memory (SRAM) device, a thyristor random access memory (TRAM) device, etc., or a nonvolatile memory device, such as a ferroelectric random access memory (FRAM) device, a magneto-resistive random access memory (MRAM) device, a phase-change random access memory (PRAM) device, etc. In response to a command/address signal CMD/ADDR received through the command/address path 160, the peripheral circuit 170 may write data DAT received through the data path 165 to the memory cell array 180, or may output data DAT read from the memory cell array 180 through the data path 165.

In a normal mode, the memory device 111a may receive the command/address signal CMD/ADDR at the command/address pins CAP from a command/address buffering device 130 in FIG. 1A. The command/address signal CMD/ADDR may be transferred through the command/address path 160 to a command decoder 171 and an address register 173 included in the peripheral circuit 170. The command decoder 171 may decode a command included in the command/address signal CMD/ADDR, and the peripheral circuit 170 may perform an operation corresponding to the decoded command.

In an example where the decoded command indicates a data write command, the memory device 111a may receive data DAT at the data pins DAT from a processing device 151 in FIG. 1A. In the normal mode, the path selecting unit 190a may connect the data pins DQP to the data path 165. Thus, the data DAT received at the data pins DAT may be transferred through the data path 165 to a data input/output (I/O) buffer 175 included in the peripheral circuit 170. The peripheral circuit 170 may write the data DAT temporarily stored in the data I/O buffer 175 to the memory cells of the memory cell array 180 at an address stored in the address register 173.

In another example where the decoded command indicates a data read command, the peripheral circuit 170 may read the data DAT from the memory cells of the memory cell array 180 at the address stored in the address register 173, and may temporarily store the read data DAT in the data I/O buffer 175. Since the path selecting unit 190a connects the data pins DQP to the data path 165 in the normal mode, the data DAT temporarily stored in the data I/O buffer 175 may output to the processing device 151 in FIG. 1A through the data path 165 and the data pins DQP In a processor mode, the memory device 111a, at the data pins DQP in a time-divisional manner, may receive a command/address signal CMD/ADDR1 from the processing device 151 in FIG. 1B, or may transmit/receive data DAT to/from the processing device 151 in FIG. 1B. In the processor mode, the path selecting unit 190a may selectively connect the data pins DQP to the data path 165 or to the command/address path 160. In some example embodiments, the path selecting unit 190a may be implemented with a (de)multiplexer or other circuit having similar operation. Further, in some example embodiments, the path selecting unit 190a may receive a selection signal for controlling the selective connection from the processing device 151 in FIG. 1B through any pin (e.g., other than the command/address pins CAP and the data pins DQP) of the memory device 111a.

For example, during a time period, the memory device 11a may receive the command/address signal CMD/ADDR1 from the processing device 151 in FIG. 1B. During the time period, the path selecting unit 190a may connect the data pins DQP to the command/address path 160. Thus, the command/address signal CMD/ADDR1 may be transferred through the command/address path 160 to the command decoder 171 and the address register 173 included in the peripheral circuit 170. In some example embodiments, the memory device 111a may further include a command/address buffer 195a that temporarily store the command/address signal CMD/ADDR1. In an example, the number of the data pins DQP may be less than the number of the command/address pins CAP, and thus the command/address signal CMD/ADDR1 may be received through the data pins DQP for a plurality of clock cycles. The command/address buffer 195a may temporarily store the command/address signal CMD/ADDR1 for the plurality of clock cycles, and, once the full command/address signal CMD/ADDR1 is stored in the command/address buffer 195a, the command/address buffer 195a may provide the command/address signal CMD/ADDR1 to the command/address path 160.

During another time period after the time period (e.g., a second time period, still during the processor mode), the path selecting unit 190a may connect the data pins DQP to the data path 165. Thus, in a case where the command/address signal CMD/ADDR1 indicates a data write command, the memory device 111a may store data DAT received through the data pins DQP, the path selecting unit 190a and the data path 165 from the processing device 151 in FIG. 1B. In a case where the command/address signal CMD/ADDR1 indicates a data read command, the memory device 111a may output the stored data DAT through the data path 165, the path selecting unit 190a and the data pins DQP to the processing device 151 in FIG. 1B.

As described above, using the path selecting unit 190a that selectively connects the data pins DQP to the data path 165 or the command/address path 160, the memory device 111a, in the time-divisional manner in the processor mode, may receive the command/address signal CMD/ADDR1 through the data pins DQP from the processing device 151 in FIG. 1B, or may transmit/receive the data DAT through the data pins DQP to/from the processing device 151 in FIG. 1B. In this manner, the path selecting unit 190a may be a selection circuit configured to select whether to send bits received at a second set of input/output terminals (e.g., DQP pins) to the command decoder 171 and address register 173 (e.g., via an internal command/address path), or to the data I/O buffer 175 (e.g., via an internal data path).

Figure 5:
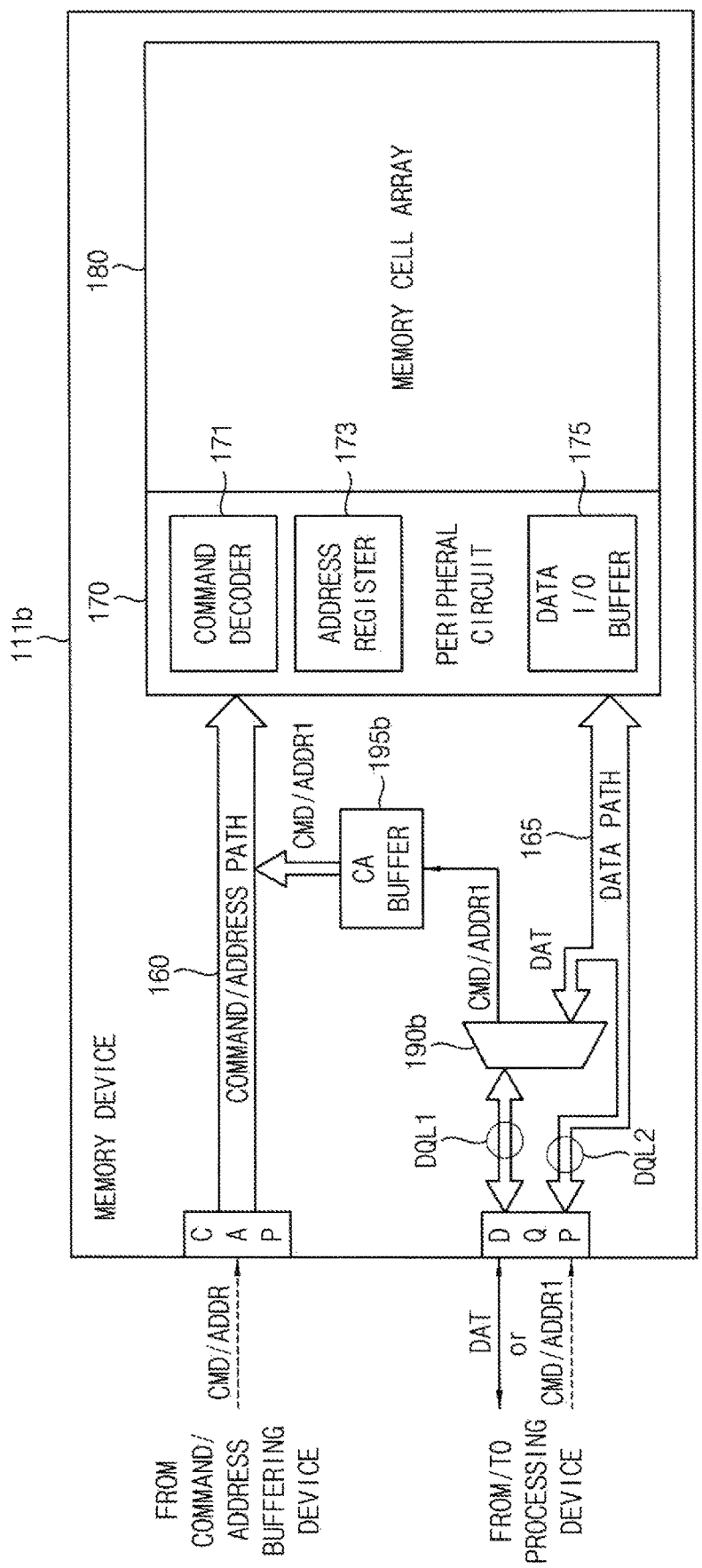
FIG. 5 is a block diagram illustrating another example of each memory device included in a memory module according to example embodiments.

FIG. 5 is a block diagram illustrating another example of each memory device included in a memory module according to example embodiments.

Referring to FIG. 5, in a memory device 111b, lines DQL1 connected to a portion of data pins DQP may be selectively connected by a path selecting unit 190b to a command/address path 160 or to a data path 165, and lines DQL2 connected to the remaining portion of the data pins DQP may be connected to (or included in) the data path 165. The path selecting unit 190b may connect the lines DQL1 connected to the portion of the data pins DQP to the data path 165 in a normal mode, and may connect the lines DQL1 connected to the portion of the data pins DQP to the command/address path 160 in a processor mode. Thus, in the normal mode, the data pins DQP may be used as pins for transmitting/receiving data DAT. In the processor mode, the data pins DQP, in a space-divisional manner, may be divided into pins for transmitting/receiving data DAT and pins for receiving a command/address signal CMD/ADDR1. The memory device 111b may have a similar configuration and a similar operation to a memory device 111a of FIG. 4, except that the data pins DQP are used as the pins for the data DAT and the pins for the command/address signal CMD/ADDR1 in the space-divisional manner. In some example embodiments, since, unlike the memory device 111a of FIG. 4 where the command/address signal CMD/ADDR1 is received through the entire data pins DQP, the command/address signal CMD/ADDR1 is received through the portion of the data pins DQP in the memory device 111b, the memory device 111b may receive the command/address signal CMD/ADDR1 for more clock cycles compared with the memory device 111a of FIG. 4. A command/address buffer 195b may store the command/address signal CMD/ADDR1 for the more clock cycles, and, once the full command/address signal CMD/ADDR1 is stored in the command/address buffer 195b, the command/address buffer 195b may provide the command/address signal CMD/ADDR1 to the command/address path 160. Thus, the DQP pins in this embodiment may include a second set and third set of input/output terminals of the memory device 111b. The second set includes a set connected to lines DQL1 which are configured to serve as data terminals during a normal operation mode of the memory module so that the processing device operates as a data buffer, and to serve as command and address terminals during a processor operation mode of the memory module so that the processing device performs arithmetic and/or logical operations on data stored in the memory device 111b. The third set includes a set connected to lines DQL2, which are connected to the data I/O buffer 175 and configured to serve as data terminals both during the normal operation mode and during the processor operation mode.

Figure 6:
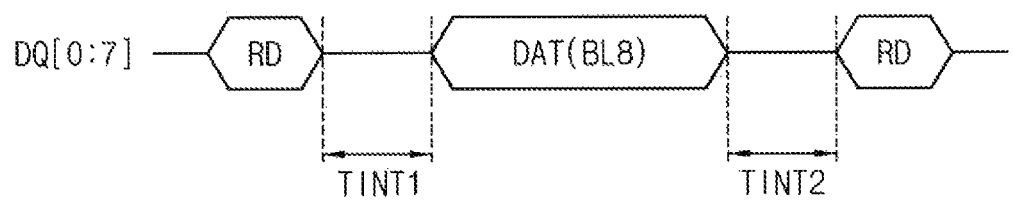
FIG. 6 is a timing diagram illustrating an example of signals transferred through data pins of a memory device of FIG. 4.
Figure 7:
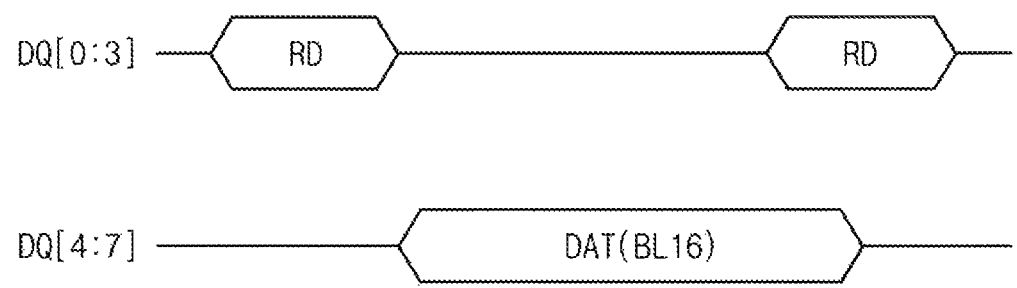
FIG. 7 is a timing diagram illustrating an example of signals transferred through data pins of a memory device of FIG. 5.

FIG. 6 is a timing diagram illustrating an example of signals transferred through data pins of a memory device of FIG. 4, and FIG. 7 is a timing diagram illustrating an example of signals transferred through data pins of a memory device of FIG. 5.

Referring to FIGS. 4 and 6, in a processor mode, a command/address signal CMD/ADDR1 (e.g., a data read command RD) may be received as a signal DQ[0:7] on data pins DQP. A memory device 111a may output, as the signal DQ[0:7] on the data pins DQP, data DAT in response to the data read command RD. In an example, the memory device 111a may output the data DAT in a burst length of 8 (BL8). In the example illustrated in FIG. 6, the data pins DQP may not be used during a predetermined time TINT1 while the data pins DQP transition from pins for receiving the command/address signal CMD/ADDR1 to pins for transmitting/receiving the data DAT. Further, after a predetermined time TINT2 from the time the data DAT are output as the signal DQ[0:7] on the data pins DQP, the memory device 111a may receive the next command/address signal CMD/ADDR1 (e.g., RD) through the data pins DQP.

Referring to FIGS. 5 and 7, a command/address signal CMD/ADDR1 (e.g., a data read command RD) may be received as a signal DQ[0:3] on a portion of data pins DQP. In a memory device 111b of FIG. 5, in a processor mode, the portion of the data pins DQP may be used as pins only for receiving the command/address signal CMD/ADDR1, and a remaining portion of the data pins DQP may be used as pins only for transmitting/receiving data DAT. Thus, the memory device 111b may output, as a signal DQ[4:7] on the remaining portion of the data pins DQP, the data DAT without waiting the predetermined time TINT1. However, since the memory device 111b of FIG. 5 receives the command/address signal CMD/ADDR1 using the less number of the data pins DQP comparing to a memory device 111a of FIG. 4, a time during which the memory device 111b receives the command/address signal CMD/ADDR1 may be longer than a time during which the memory device 111a of FIG. 4 receives the command/address signal CMD/ADDR1. Further, since the memory device 111b of FIG. 5 transmits/receives the data DAT using the less number of the data pins DQP comparing to the memory device 111a of FIG. 4, a time during which the memory device 111b transmits/receives the data DAT may be longer than a time during which the memory device 111a of FIG. 4 transmits/receives the data DAT. For example, four pins of eight data pins DQP may be used to transmit/receive the data DAT in the memory device 111b. In this case, to output the same size data DAT that are output in a burst length of 8 (BL8) by the memory device 111a of FIG. 4, the memory device 111b may output the data DAT in a burst length of 16 (BL16).

Figure 8:
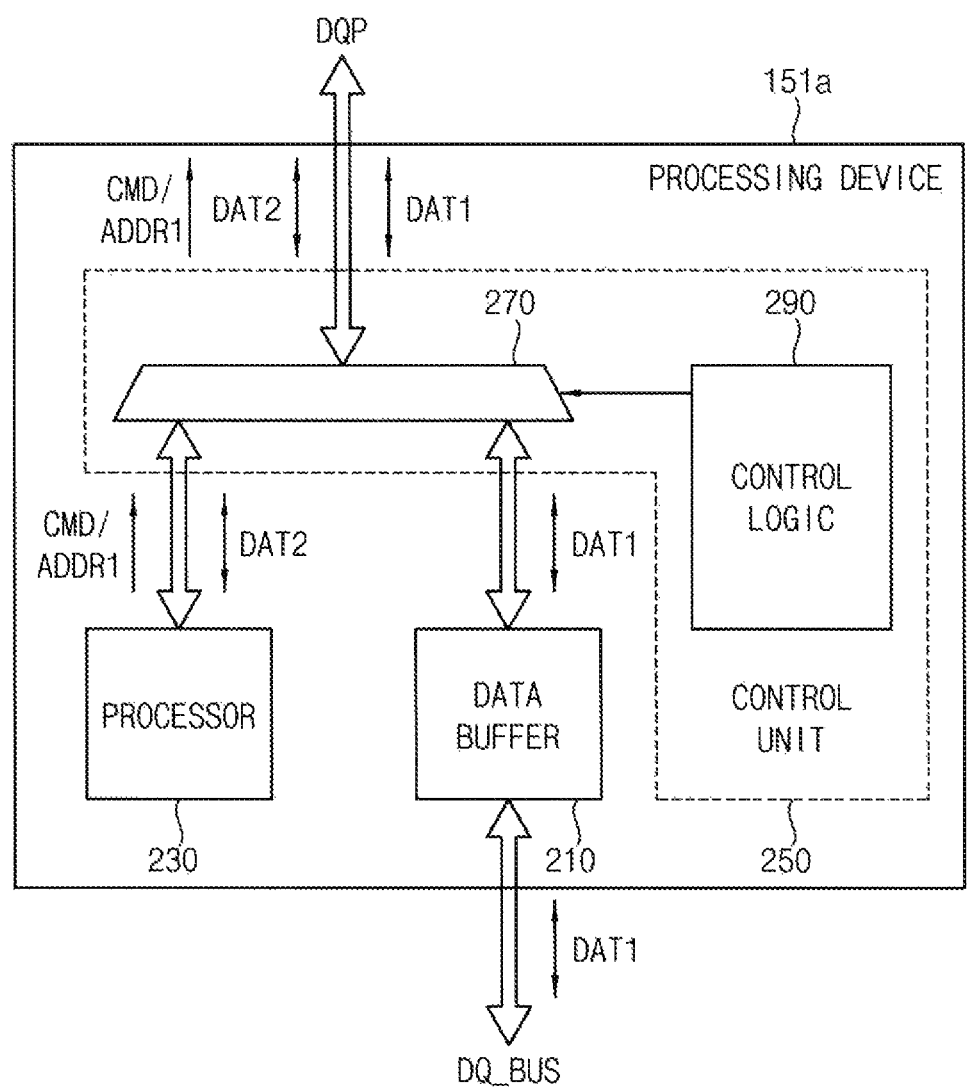
FIG. 8 is a block diagram illustrating an example of each processing device included in a memory module according to example embodiments.
Figure 9:
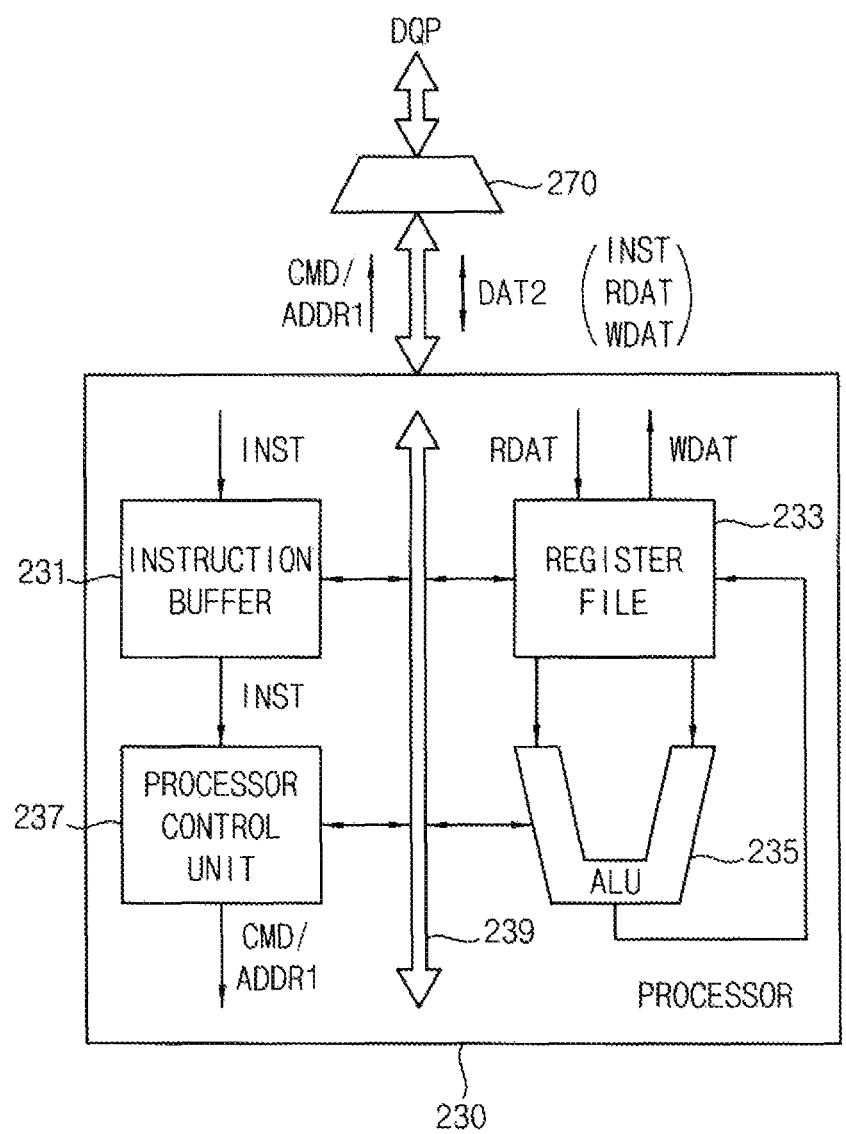
FIG. 9 is a block diagram illustrating an example of a processor included in a processing device of FIG. 8.

FIG. 8 is a block diagram illustrating an example of each processing device included in a memory module according to example embodiments, and FIG. 9 is a block diagram illustrating an example of a processor included in a processing device of FIG. 8.

Referring to FIG. 8, a processing device 151a (e.g., each processing device 151 through 158 illustrated in FIGS. 1A and 1B) may include a data buffer 210 for buffering first data DAT1 transferred between a memory controller and a corresponding memory device, a processor 230 for performing data processing on second data DAT2 stored in the memory device, and a control unit 250 (e.g., control circuit) for connecting the memory device and the data buffer 210 in a normal mode and for connecting the memory device and the processor 230 in a processor mode.

The control unit 250 may include a (de)multiplexer 270 for selectively connecting data pins DQP of the memory device to the data buffer 210 or the processor 230, and control logic 290 for controlling the (de)multiplexer 270. Further, the control logic 290 may control an overall operation of the processing device 151a.

The data buffer 210 may be a data buffer in compliance with a memory module standard (e.g., a DDR4 LRDIMM standard). The data buffer 210 may be connected to a data bus DQ_BUS, and may be further connected by the control unit 250 to the data pins DQP of the memory device in the normal mode. In the normal mode, the data buffer 210 may buffer the first data DAT1 transferred between the memory controller and the memory device. In some example embodiments, the data buffer 210 may include a synchronization circuit, a signal amplifier, an input/output circuit, etc. The data buffer 210, also described as a data buffer portion of the processing device 151a, may store and transfer data, such that the same data received at the data buffer 210 is the same data sent from the data buffer 210. Normal mode, or normal operation mode, may also be described herein as data buffer mode. During this mode, the data buffer 230 is operating on data passing between data bus DQ_BUS and data pins DQP. The first data DAT1 may be internally transferred within the processing device 151a between the data buffer 210 and the control unit 250 via a plurality of first input/output lines connected between a selection circuit such as multiplexer 270 and the data buffer portion 210.

The processor 230 may be connected by the control unit 250 to the data pins DQP of the memory device in the processor mode. In the processor mode 230, the processor 230 may initially receive a controller-generated command, such as a processor mode entry command, for example, through either the command/address buffering device 130 and a corresponding memory device and DQP pins, or directly from a memory controller through DQ_BUS, data buffer 210, and multiplexer 270. In response, the processor 230 transmits a command/address signal CMD/ADDR1 to the data pins DQP (in a time-divisional manner as illustrated in FIG. 6 or in a space-divisional manner as illustrated in FIG. 7), and may receive the second data DAT2 stored in the memory device through the data pins DQP. For example, the command/address signal CMD/ADDR1 may be based on a command from a memory controller, or may be generated in response to a command, such as a processor mode entry command, from a memory controller. The processor 230 may perform any data processing including an arithmetic operation and/or a logical operation on the received second data DAT2. Further, the processor 230 may transmit the command/address signal CMD/ADDR1, may provide, as the second data DAT2, a result of the data processing to the data pins DQP to write the result of the data processing to the memory device, or may output the result through DQ_BUS. According to example embodiments, the processor 230 may be a central processing unit (CPU), a microcontroller, a microprocessor, a hardware accelerator, or any data processing device.

In some example embodiments, as illustrated in FIG. 9, the processor 230 may include an instruction buffer 231, a register file 233, an arithmetic logic unit (ALU) 235, a processor control unit 237 and an interconnect 239. The instruction buffer 231 may receive, as the second data DAT2, an instruction INST through the (de)multiplexer 270 from the data pins DQP of the memory device, and may temporarily store the instruction INST. The instruction INST may be, for example, a machine language code indicating the data processing performed by the processor 230. The register file 233 may receive, as the second data DAT2, input data RDAT through the (de)multiplexer 270 from the data pins DQP of the memory device, and may temporarily store the input data RDAT. The ALU 235 may perform, as the data processing, an arithmetic operation or a logical operation corresponding to the instruction INST on the input data RDAT. A result of the arithmetic operation or the logical operation may be temporarily stored in the register file 233. The result of the arithmetic operation or the logical operation temporarily stored in the register file 233 may be used as an input of the next arithmetic operation or the next logical operation, or may be provided as write data WDAT through the (de)multiplexer 270 to the data pins DQP of the memory device. To perform these operations, the processor control unit 237 may control the ALU 235 and the register file 233 based on the instruction INST stored in the instruction buffer 231. Further, the processor control unit 237 may generate the command/address signal CMD/ADDR1 for controlling the memory device, and may transmit the command/address signal CMD/ADDR1 through the (de)multiplexer 270 to the data pins DQP of the memory device. The interconnect 239 may provide connections among the instruction buffer 231, the register file 233, the ALU 235 and the processor control unit 237. Although a configuration of the processor 230 is exemplified in FIG. 9, the processor 230 according to example embodiments is not limited to the configuration illustrated in FIG. 9.

Figure 10:
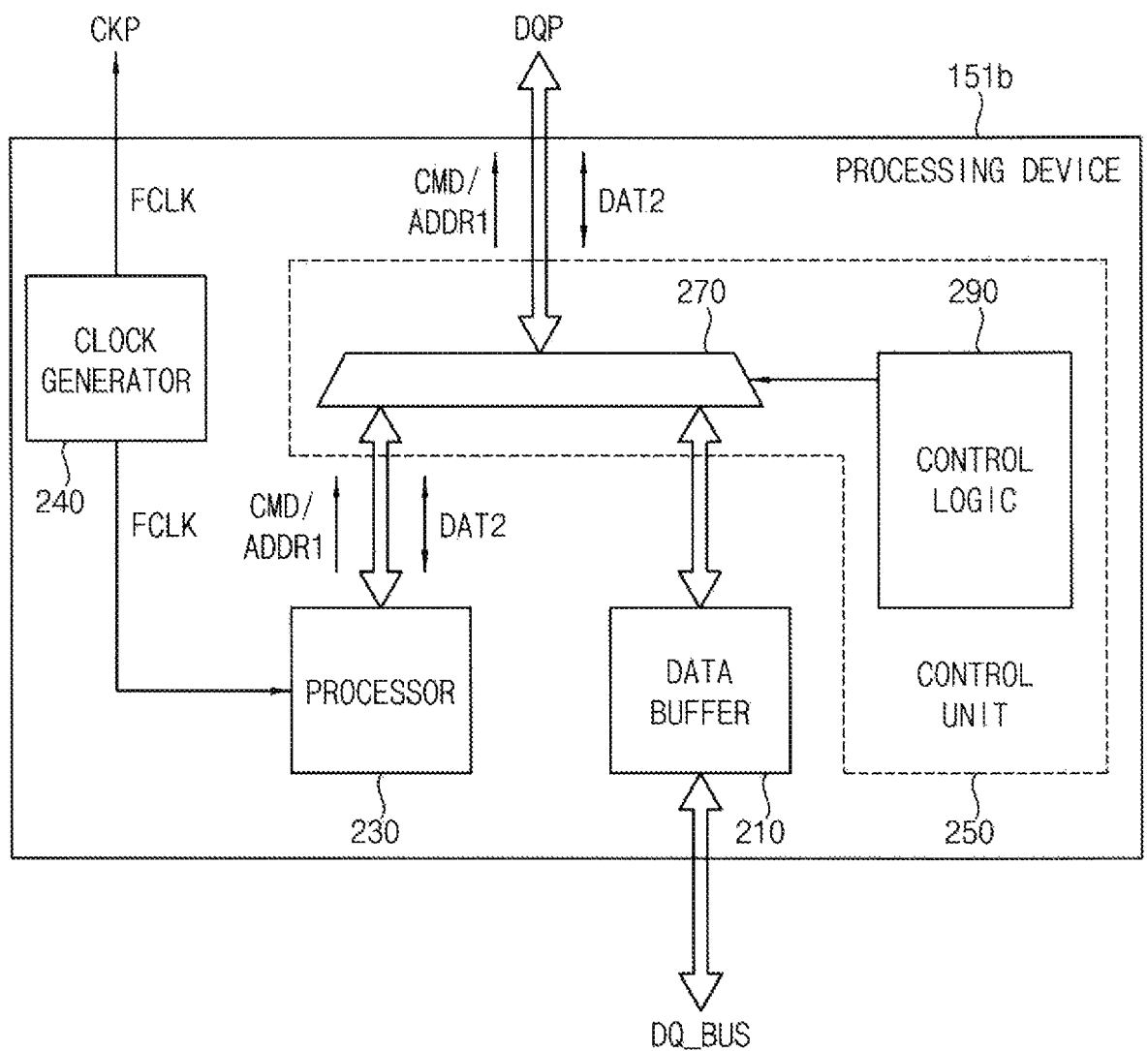
FIG. 10 is a block diagram illustrating another example of each processing device included in a memory module according to example embodiments.
Figure 11A:
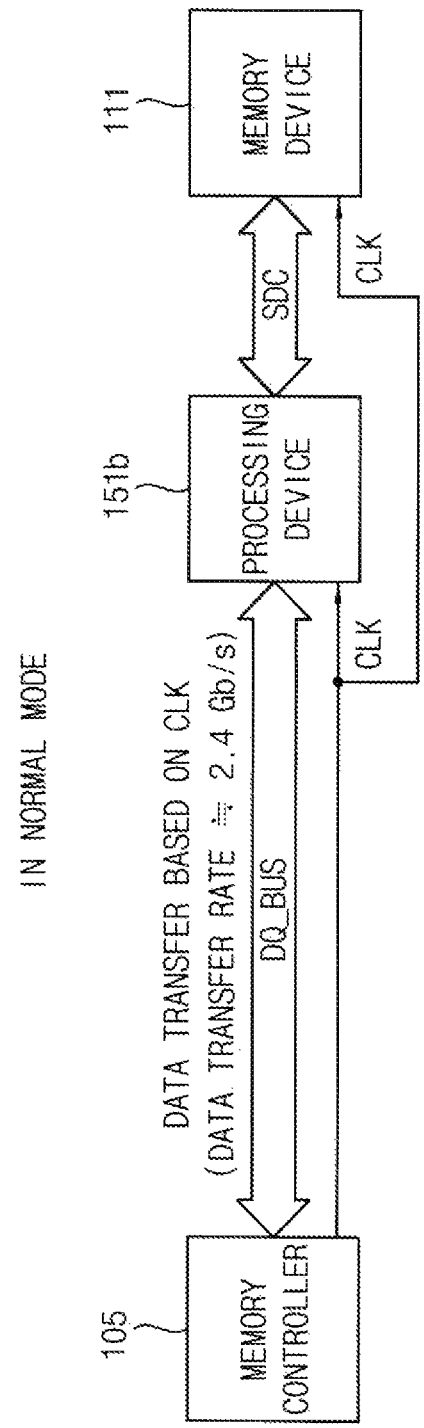
FIG. 11A is a diagram for describing an example of data transfer in a normal mode of a memory module including a processing device of FIG. 10.
Figure 11B:
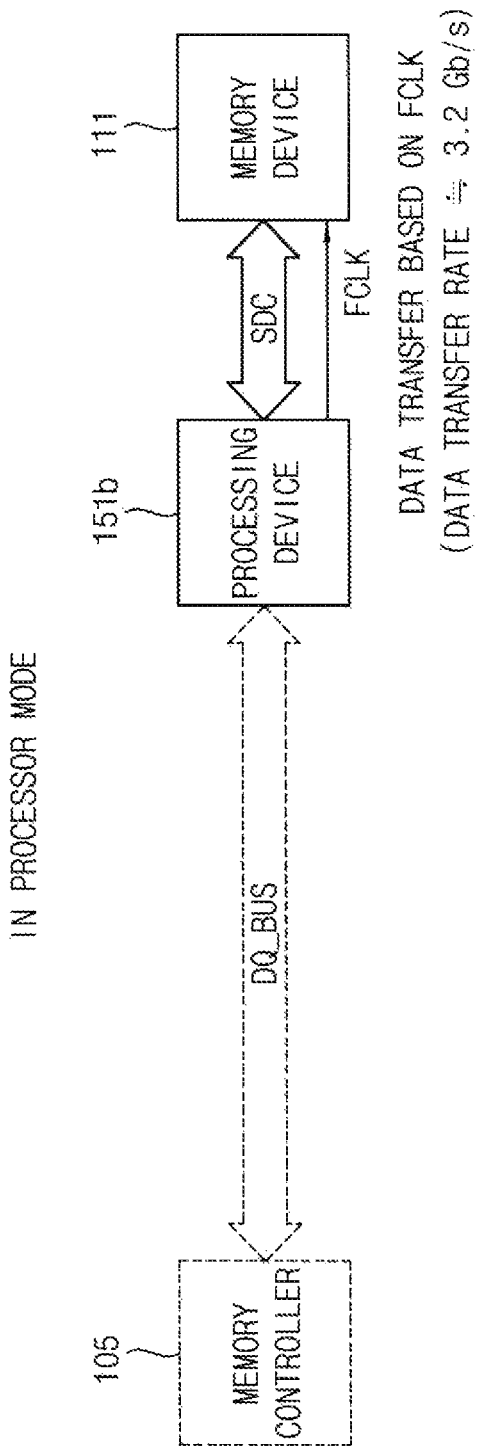
FIG. 11B is a diagram for describing an example of data transfer in a processor mode of a memory module including a processing device of FIG. 10.

FIG. 10 is a block diagram illustrating another example of each processing device included in a memory module according to example embodiments, FIG. 11A is a diagram for describing an example of data transfer in a normal mode of a memory module including a processing device of FIG. 10, and FIG. 11B is a diagram for describing an example of data transfer in a processor mode of a memory module including a processing device of FIG. 10.

Referring to FIG. 10, a processing device 151b may have a similar configuration and a similar operation to a processing device 151a of FIG. 8, except that the processing device 151b may further include a clock generator 240. In a processor mode, the clock generator 240 may generate a fast clock signal FCLK, and may provide the fast clock signal FCLK to a clock pin CKP of a memory device connected to the processing device 151b. In some example embodiments, the fast clock signal FCLK generated by the clock generator 240 in the processor mode may have a clock frequency higher than that of a clock signal (CLK in FIG. 11A) provided from a memory controller in a normal mode.

Referring to FIG. 11A, in the normal mode, the processing device 151a and the memory device 111 may receive the clock signal CLK from the memory controller 105 (through a command/address buffering device 130 in FIG. 1A). Data transfer between the memory controller 105 and the processing device 151a (or the memory device 111) may be performed based on the clock signal CLK.

Referring to FIG. 11B, in the processor mode, the processing device 151a may provide the memory device 111 with the fast clock signal FCLK, and data transfer between the processing device 151a and the memory device 111 may be performed based on the fast clock signal FCLK. While the data transfer in the normal mode is performed through a data bus DQ_BUS having a relatively long distance, the data transfer in the processor mode may be performed through a short data connection SDC between the processing device 151a and the memory device 111. Thus, the data transfer in the processor mode may have a signaling condition better than that of the data transfer in the normal mode. Further, while the data bus DQ_BUS is connected to a plurality of memory modules in a multi-drop connection, the short data connection SDC between the processing device 151a and the memory device 111 may be a P-to-P connection. Thus, the signaling condition of the data transfer in the processor mode may be far better than that of the data transfer in the normal mode. Accordingly, even if a data transfer rate in the processor mode is higher than a data transfer rate in the normal mode, data DAT2 and a command/address signal CMD/ADDR1 may be accurately transferred between the processing device 151a and the memory device 111. For example, the data transfer rate in the normal mode may be about 2.4 Gb/s, and the data transfer rate in the processor mode may be about 3.2 Gb/s.

Figure 12:
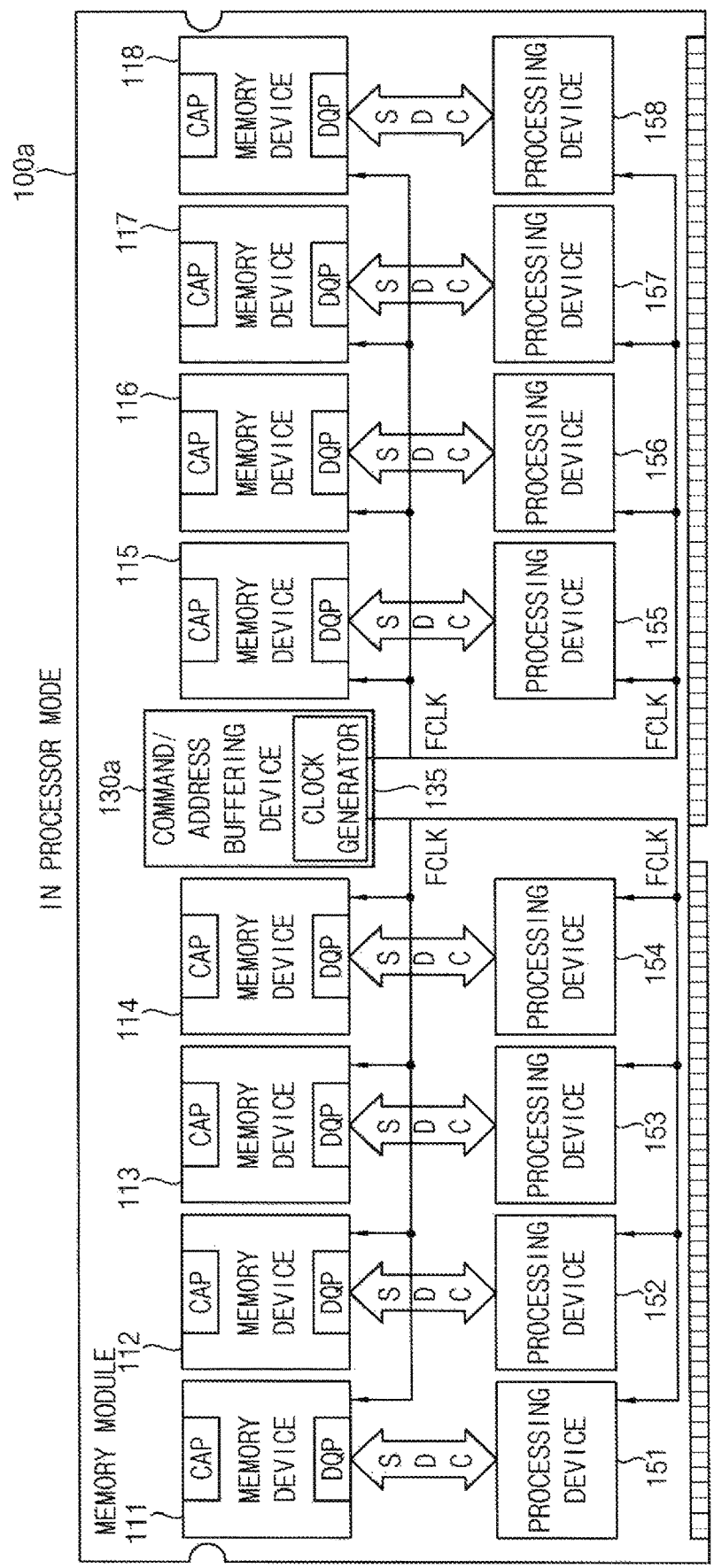
FIG. 12 is a block diagram illustrating a memory module in a processor mode according to example embodiments.

FIG. 12 is a block diagram illustrating a memory module in a processor mode according to example embodiments.

Referring to FIG. 12, a memory module 100a may have a similar configuration and a similar operation to a memory module 100 of FIG. 1B, except that a command/address buffering device 130a includes a clock generator 135 that generates a fast clock signal FCLK in a processor mode. The clock generator 135 of the command/address buffering device 130a may provide the fast clock signal FCLK to a plurality of memory devices 111 through 118 and a plurality of processing devices 151 through 158 in the processor mode. In the processor mode, each processing device 151 through 158 and a corresponding memory device 111 through 118 may perform data transfer through a short data connection SDC based on the fast clock signal FCLK, thereby improving a data transfer rate and a data processing speed of the memory module 100a in the processor mode.

Figure 13:
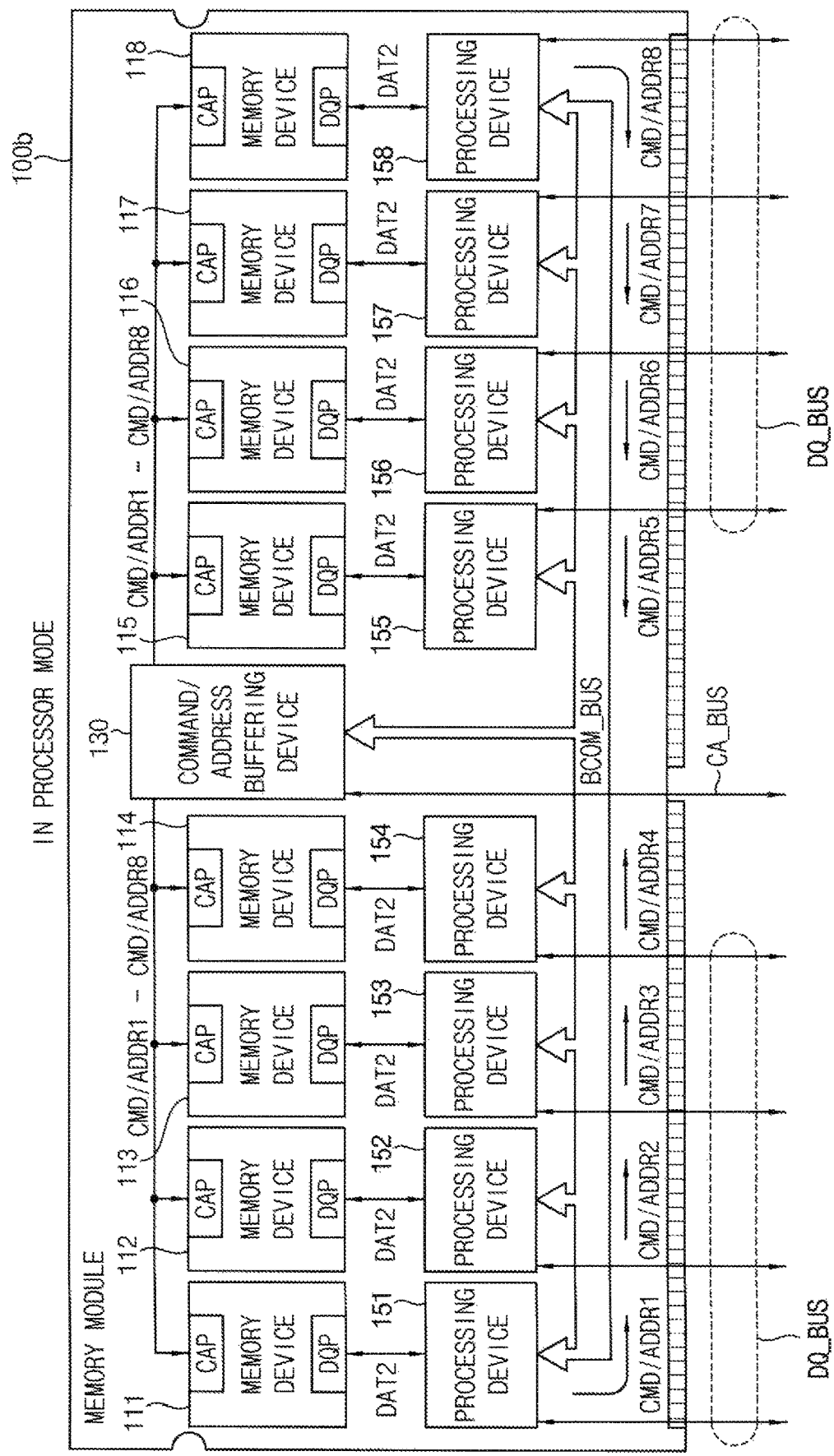
FIG. 13 is a block diagram illustrating a memory module in a processor mode according to example embodiments.
Figure 14:
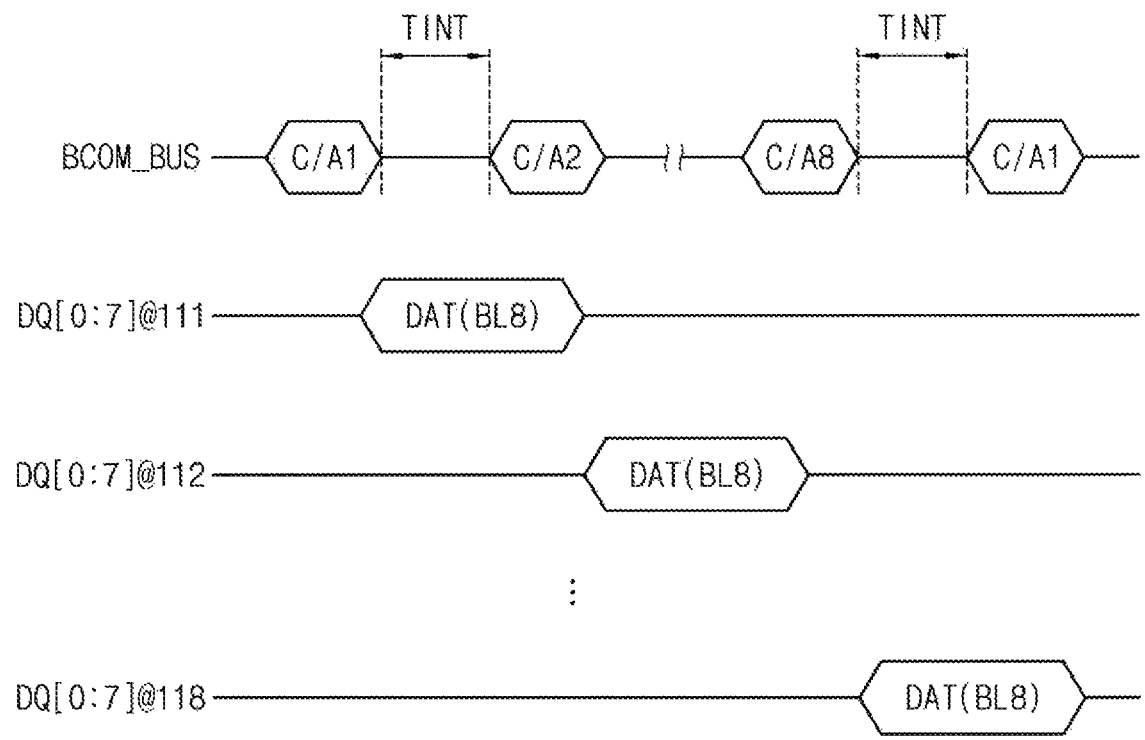
FIG. 14 is a timing diagram for describing an operation of a memory module of FIG. 13, according to example embodiments.

FIG. 13 is a block diagram illustrating a memory module in a processor mode according to example embodiments, and FIG. 14 is a timing diagram for describing an operation of a memory module of FIG. 13.

Referring to FIG. 13, a memory module 100b may have a similar configuration and a similar operation to a memory module 100 of FIG. 1B, except that, in a processor mode, command/address signals CMD/ADDR1 through CMD/ADDR8 may be transferred through a control bus BCOM_BUS. In the processor mode, a plurality of processing devices 151 through 158 may generate a plurality of command/address signals CMD/ADDR1 through CMD/ADDR8, respectively, and may transfer the command/address signals CMD/ADDR1 through CMD/ADDR8 to a command/address buffering device 130 through the control bus BCOM_BUS between the processing devices 151 through 158 and the command/address buffering device 130.

Further, the command/address signals CMD/ADDR1 through CMD/ADDR8 may be initiated by or generated in response to a command (e.g., processor mode entry command) received initially by command/address bus CA_BUS from a memory controller, and sent to processing devices 151 through 158 through the control bus BCOM_BUS. The command/address buffering device 130 may provide the command/address signals CMD/ADDR1 through CMD/ADDR8 received through the control bus BCOM_BUS to the memory devices 111 through 118, respectively.

In some example embodiments, the command/address signals CMD/ADDR1 through CMD/ADDR8 may be transferred in a time-divisional manner through the control bus BCOM and the command/address buffering device 130 to the memory devices 111 through 118, respectively. For example, as illustrated in FIG. 14, first through eighth processing devices 151 through 158 may sequentially transfer first through eighth command/address signals C/A1 through C/A8. The first processing device 151 may transfer the first command/address signal C/A1 to the control bus BCOM_BUS, and the command/address buffering device 130 may transfer the first command/address signal C/A1 to first through eighth memory devices 111 through 118. In some example embodiments, the command/address buffering device 130 may transfer a first device identifier (ID) along with the first command/address signal C/A1 to the first through eighth memory devices 111 through 118. The first memory device 111 may transmit/receive, as a signal DQ[0:7]@111 on data pins DQP, data DAT in response to the first command/address signal C/A1 and the first device ID. For example, the first device ID may be transmitted as part of the command signal, as a separate, previously-received signal, and/or may include a signal transmitted on a separate line or set of lines of the memory module 100b for selecting a memory device. After a predetermined time TINT from transfer of the first command/address signal C/A1, the second processing device 152 may transfer the second command/address signal C/A2 to the control bus BCOM_BUS, and the command/address buffering device 130 may transfer the second command/address signal C/A2 and a second device ID indicating the second memory device 112 to the first through eighth memory devices 111 through 118. The second memory device 112 may transmit/receive, as a signal DQ[0:7]@112 on data pins DQP, data DAT in response to the second command/address signal C/A2 and the second device ID. Similarly, the third through eighth processing devices 153 through 158 may sequentially output the third through eighth command/address signals C/A8, and each memory device 113 through 118 may transmit/receive, as signals DQ[0:7]@118 on data pins DQP, data DAT in response to the corresponding command/address signal C/A8.

Figure 8A:
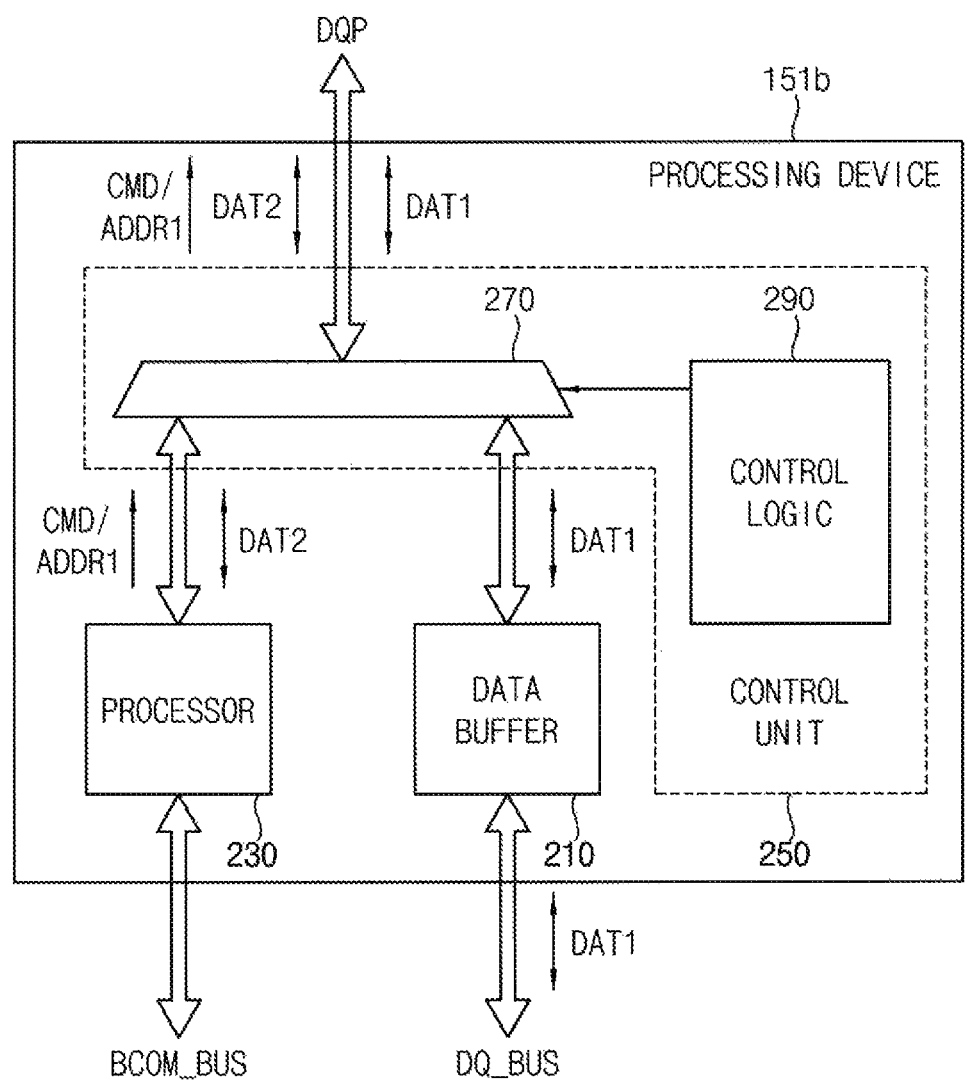
FIG. 8A is a block diagram illustrating an example of each processing device included in a memory module according to other example embodiments.

FIG. 8A depicts an example of a processing device 151b, which may be one of the processing devices 151-158 of FIG. 13.

Referring to FIG. 8A, a processing device 151b (e.g., each processing device 151 through 158 illustrated in FIG. 13) may include a data buffer 210 for buffering first data DAT1 transferred between a memory controller and a corresponding memory device, a processor 230 for performing data processing on second data DAT2 stored in the memory device, and a control unit 250 (e.g., control circuit) for connecting the memory device and the data buffer 210 in a normal mode and for connecting the memory device and the processor 230 in a processor mode.

The control unit 250 may include a (de)multiplexer 270 for selectively connecting data pins DQP of the memory device to the data buffer 210 or the processor 230, and control logic 290 for controlling the (de)multiplexer 270. Further, the control logic 290 may control an overall operation of the processing device 151b.

The data buffer 210 may be a data buffer in compliance with a memory module standard (e.g., a DDR4 LRDIMM standard). The data buffer 210 may be connected to a data bus DQ_BUS, and may be further connected by the control unit 250 to the data pins DQP of the memory device in the normal mode. In the normal mode, the data buffer 210 may buffer the first data DAT1 transferred between the memory controller and the memory device. In some example embodiments, the data buffer 210 may include a synchronization circuit, a signal amplifier, an input/output circuit, etc. The data buffer 210, also described as a data buffer portion of the processing device 151b, may store and transfer data, such that the same data received at the data buffer 210 is the same data sent from the data buffer 210. Normal mode, or normal operation mode, may also be described herein as data buffer mode. During this mode, the data buffer 210 is operating on data passing between data bus DQ_BUS and data pins DQP. The first data DAT1 may be internally transferred within the processing device 151b between the data buffer 210 and the control unit 250 via a plurality of first input/output lines connected between a selection circuit such as multiplexer 270 and the data buffer portion 210.

The processor 230 may be connected by the control unit 250 to the data pins DQP of the memory device in the processor mode. In the processor mode 230, the processor 230 may initially receive, e.g., from a memory controller, a processor mode entry command, for example, through the control bus BCOM_BUS. Control bus BCOM_BUS may connect to external connection terminals of the processing device 151b, which terminals connect through internal lines to processor 230. In the embodiment of FIG. 8A, the BCOM_BUS lines are shown as directly connected to the processor 230. However, in another embodiment, the BCOM_BUS lines may connect between external connection terminals of the processing device 151b and multiplexer 270, and the external commands may arrive at the processor 230 through the multiplexer 270.

In some embodiments, the signals sent to and/or received from data pins DQP of the respective memory device, and the signals sent to and/or received from the data bus DQ_BUS may be communicated to and from the processing device through different sets of input/output terminals of the processing device, which may be a separate sets of I/O terminals from those used for the control bus BCOM_BUS. The processing device 151a of FIG. 8 may have similar input/output terminals for the DQP and DQ_BUS.

In response to the processor mode entry command, the processor 230 transmits a command/address signal CMD/ADDR1 (or other processors transmit command address signals CMD/ADDR2 through CMD/ADDR8) back through control bus BCOM_BUS to the command/address buffering device 130, which then transmits the commands to the appropriate memory device or devices.

In response to the command/address signal, the appropriate memory device may send data DAT2 to the processing device, e.g., through DQP pins. The processor 230 may perform any data processing including an arithmetic operation and/or a logical operation on the received second data DAT2. Further, the processor 230 may provide, as the second data DAT2, a result of the data processing to the data pins DQP to write the result of the data processing to the memory device, or may output the result through DQ_BUS. According to example embodiments, the processor 230 may be a central processing unit (CPU), a microcontroller, a microprocessor, a hardware accelerator, or any data processing device.

The second data DAT2 may be internally transferred within the processing device 151b between the processor 230 and the control unit 250 via a plurality of second input/output lines connected between a selection circuit such as multiplexer 270 and the processor portion 210.

Figure 15:
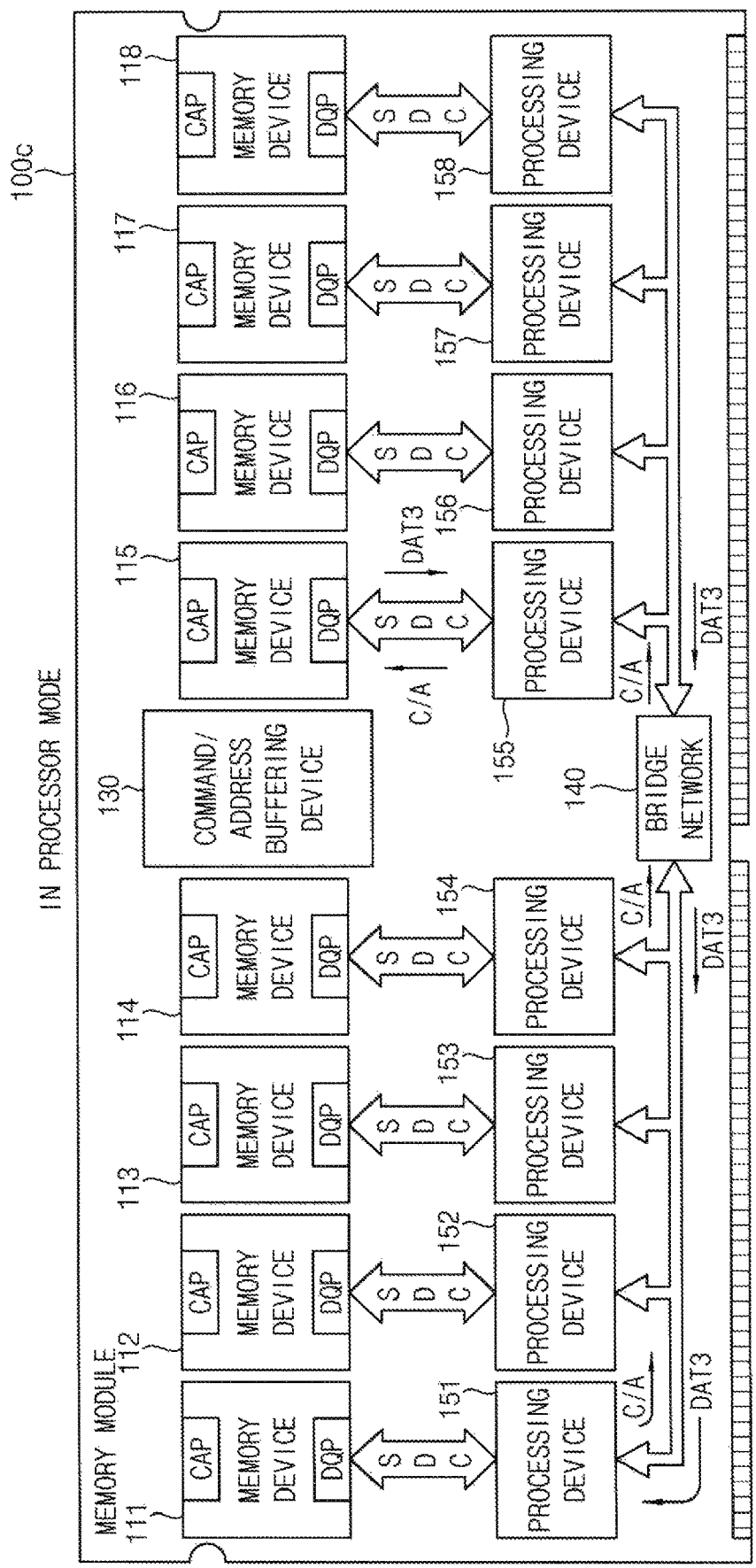
FIG. 15 is a block diagram illustrating a memory module in a processor mode according to example embodiments.

FIG. 15 is a block diagram illustrating a memory module in a processor mode according to example embodiments.

Referring to FIG. 15, a memory module 100c may have a similar configuration and a similar operation to a memory module 100 of FIGS. 1A and 1B (e.g., including similar CA_BUS and DQ_BUS connections, not shown in FIG. 15), except that the memory module 100c may further include a bridge network 140 for providing a connection among a plurality of processing devices 151 through 158. In a processor mode, the bridge network 140 may provide a connection between one processing device and another processing device, and the one processing device may perform data processing on data stored in a memory device directly connected to the another processing device by using the bridge network 140. For example, in the processor mode, a first processing device 151 of the processing devices 151 through 158 may transfer a command/address signal C/A indicating a data read command through the bridge network 140 to a second processing device 155 of the processing devices 151 through 158, and the second processing device 155 may transfer the command/address signal C/A to a corresponding memory device 115. The memory device 115 may output data DAT3 in response to the command/address signal C/A, and the first processing device 151 may receive the data DAT3 output from the memory device 115 through the second processing device 155 and the bridge network 140. Thus, the first processing device 151 may receive the data DAT3 stored not only in a memory device 111 directly connected to the first processing device 151 but also in another memory device 115 other than the memory device 111 directly connected to the first processing device 151, and may perform data processing on the data DAT stored in the another memory device 115.

Figure 16A:
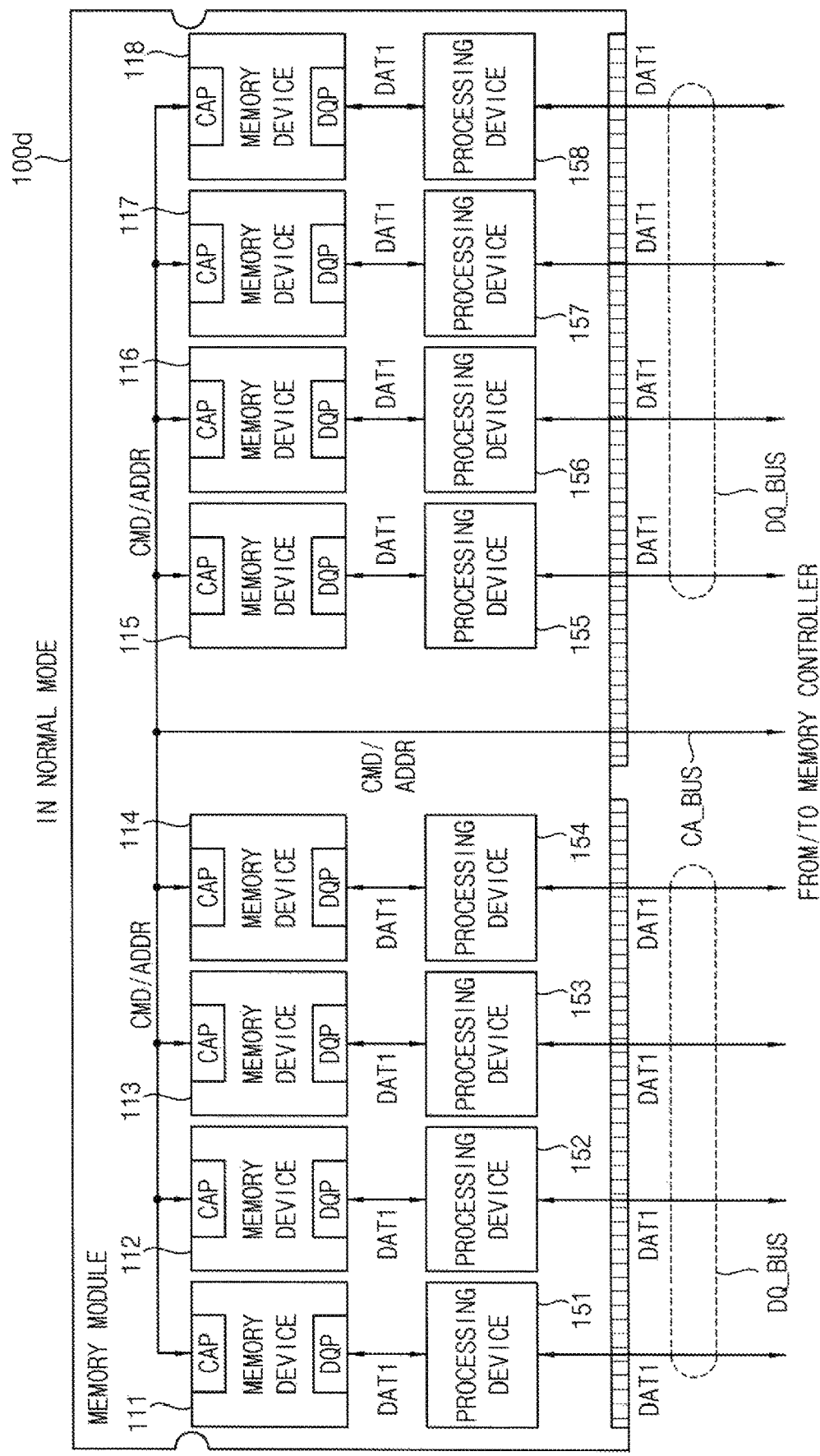
FIG. 16A is a block diagram illustrating a memory module in a normal mode according to example embodiments.
Figure 16B:
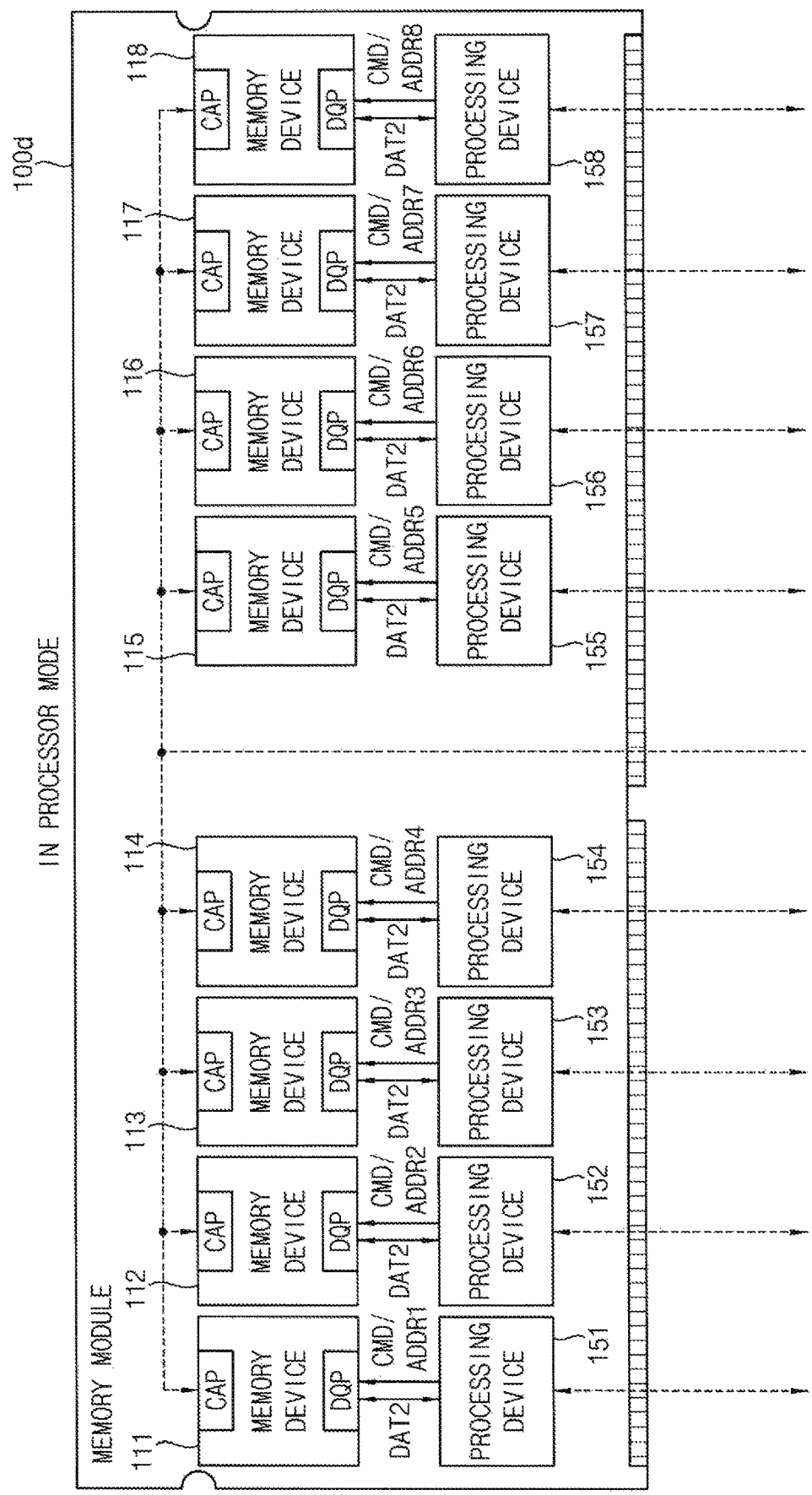
FIG. 16B is a block diagram illustrating a memory module in a processor mode according to example embodiments.

FIG. 16A is a block diagram illustrating a memory module in a normal mode according to example embodiments, and FIG. 16B is a block diagram illustrating a memory module in a processor mode according to example embodiments.

Referring to FIGS. 16A and 16B, a memory module 100d may have a similar configuration and a similar operation to a memory module 100 of FIGS. 1A and 1B, except that the memory module 100d may not include a command/address buffering device 130 in FIGS. 1A and 1B. In the memory module 100d, command/address pins CAP of a plurality of memory devices 111 through 118 may be directly connected to a command/address bus CA_BUS, and may directly receive a command/address signal CMD/ADDR from a memory controller.

As further described in FIGS. 1A, 2A, 12, 13, 15, 16A, and 16B, and as can be seen from the various embodiments discussed above, a memory module may include a set of memory module terminals for connecting the memory module to an external device. The memory module terminals may be positioned on one edge of the memory module (e.g., the bottom as shown in the figures). A plurality of processing data buffers may be positioned between the set of memory module terminals and a plurality of memory devices. In some embodiments, a command/address buffering device is between a first subset of the memory devices and a second subset of the memory devices. In addition, the command/address buffering device may have the same number of memory devices on either side of the command/address buffering device (e.g., four, as shown in the example embodiments).

Also, according to the various embodiments described above, a method of performing near data processing may be performed. The method may include, for example, receiving a first mode command at a processing data buffer of a memory module, the first mode command instructing the processing data buffer to operate in processor mode. The method may also include, while operating in the processor mode, transmitting, from the processing data buffer, command and address information to a memory device to which the processing data buffer is connected, and receiving a second mode command at the processing data buffer, the second mode command instructing the processing data buffer to operate as a data buffer for the memory device. The first mode command may be, for example, a host or controller-generated command such as a processor mode entry command, and the second mode command may be a host or controller-generated command such as a processor mode exit command. The command and address information transmitted during the processor mode may include a memory device identifier. The method may further include, while operating in the data buffer mode, transmitting, from the processing data buffer, data to the memory device.

In some embodiments, while operating in the processor mode the processing data buffer may transmit the command and address information to the memory device at a first time, and may transmit data to the memory device at a second time after the first time. A clock speed used for transmitting the data from the processing data buffer to the memory device during the processor mode may be faster than a clock speed used for transmitting data from the processing data buffer to the memory device during the data buffer mode.

In one embodiment, as discussed above, after completing transmitting the command and address information from the processing data buffer to the memory device, there is a delay before transmitting the data from the processing data buffer to the to the memory device. During the delay, a selection circuit of the processing data buffer may transition between selecting a command/address path for incoming bits and selecting a data path for incoming bits.

In certain embodiments, both the data and the command and address information are transmitted to the memory device over the same set of processing data buffer output terminals. In other embodiments, the data is transmitted to the memory device over a first set of processing data buffer output terminals, and the command and address information is transmitted to the memory device over a second set of processing data buffer output terminals.

Figure 17:
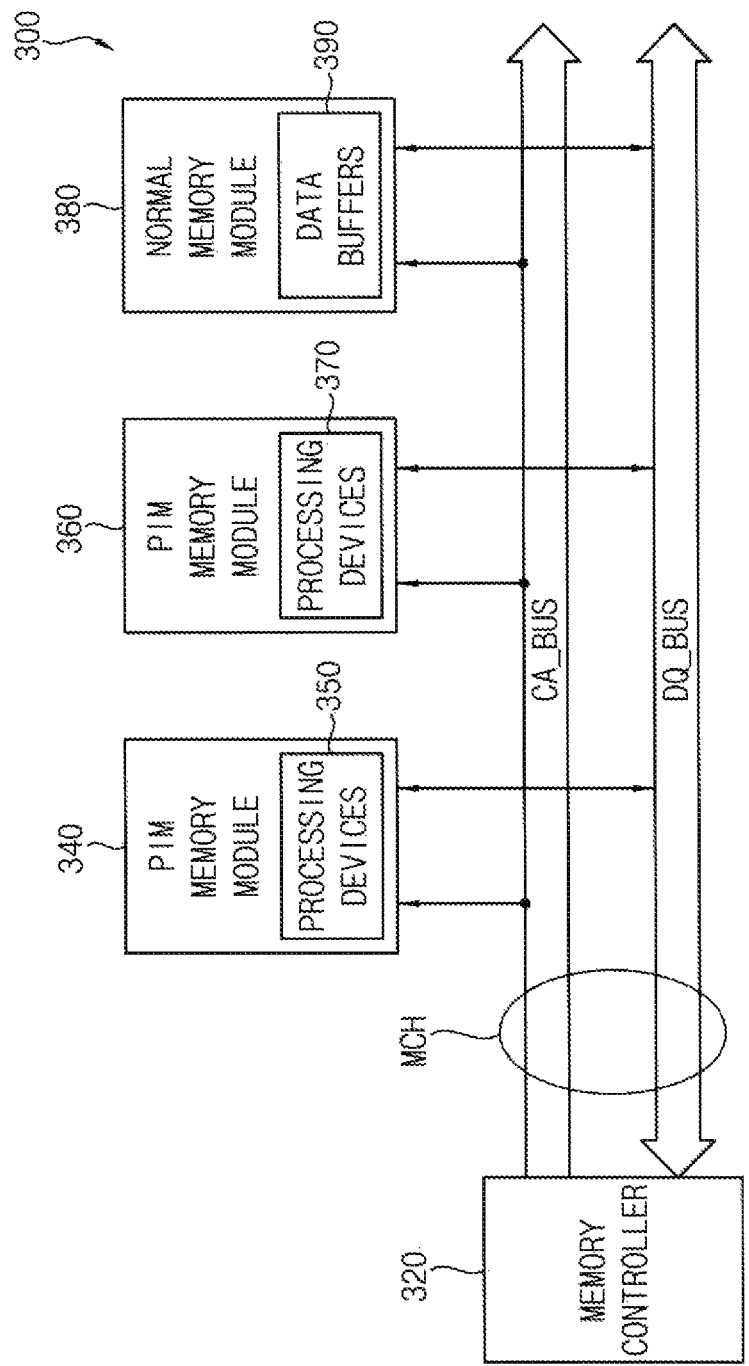
FIG. 17 is a block diagram illustrating a memory system according to example embodiments.
Figure 18:
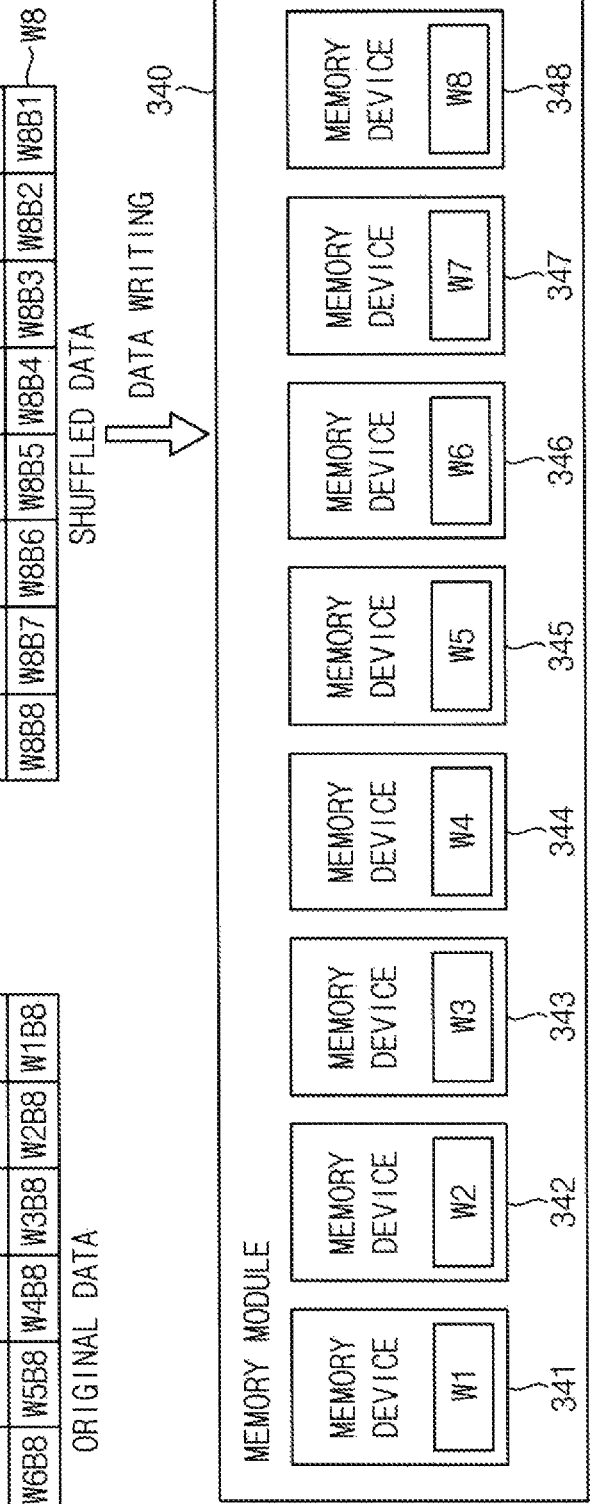
FIG. 18 is a diagram for describing an example of a bit arrangement change performed in a memory system according to example embodiments.

FIG. 17 is a block diagram illustrating a memory system according to example embodiments, and FIG. 18 is a diagram for describing an example of a bit arrangement change performed in a memory system according to example embodiments.

Referring to FIG. 17, a memory system 300 may include at least one memory module 340 and 360 including processing devices 350 and 370, and a memory controller 320 for controlling the memory module 340 and 360. The memory module 340 and 360 including processing devices 350 and 370 may be referred to as a PIM (or NDP) memory module, and may be a memory module 100 of FIGS. 1A and 1B, a memory module 100a of FIG. 12, a memory module 100b of FIG. 13, a memory module 100c of FIG. 15, or a memory module 100d of FIGS. 16A and 16B. The memory module 340 and 360 may be connected to the memory controller 320 through a memory channel MCH including a command/address bus CA_BUS and a data bus DQ_BUS. The memory system 300 may be a memory system included in any computing system, such as a personal computer, a server computer, a workstation, a laptop computer, a mobile computer, a digital TV, etc.

In some example embodiments, the memory system 300 may further include a normal memory module 380 connected to the same memory channel MCH to which the memory modules 340 and 360 are connected. The normal memory module 380 may include data buffers 390 instead of the processing devices 350 and 370. The normal memory module 380 may be a memory module (e.g., a DDR4 LRDIMM) in compliance with a memory module standard.

Since the PIM (or NDP) memory module 340 and 360 of the memory system 300 is connected to the memory channel MCH in compliance with the memory module standard, a storage capacity of the memory system 300 may be readily increased by increasing the number of memory modules 340, 360 and 380 connected to the memory channel MCH. Further, in the memory system 300, the processing devices 350 and 370 included in each memory module 340 and 360 may perform data processing in parallel, and thus the memory system 300 may have an improved data processing performance. Further, the data processing performance of the memory system 300 may be readily improved by increasing the number of the memory modules 340 and 360.

In some example embodiments, the memory controller 320 may provide each memory module (e.g., 340) with data on which a bit arrangement change is performed in a normal mode such that each memory device included in the memory module 340 may store a full data word. FIG. 18 illustrates an example of a computing system where a 64-bit data word is employed and one cache line has a size of 64 bytes. Generally, the memory controller 320 may write data to the memory module on a cache line basis. For example, the memory controller 320 may transfer a data write command to the memory module 340, and may further transfer data in a burst length of 8 to the memory module 340 including eight x8 memory devices 341 through 348. In a case where the memory controller 320 transfers original data including first through eighth data words W1 through W8 in one cache line without the bit arrangement change, the memory devices 341 through 348 may store different bytes of the first through eighth data words W1 through W8. For example, a first memory device 341 may store first bytes W1B1 through W8B1 of the first through eighth data words W1 through W8. In this case, in the processor mode, a processing device connected to the first memory device 341 may not be able to read a full data word, which is a unit of data processing, from the first memory device 341. However, in the memory system 300 according to example embodiments, the memory controller 320 may provide the memory module 340 with the data on which the bit arrangement change is performed. In some example embodiments, the bit arrangement change may be performed on a cache line basis. As illustrated in FIG. 18, the bit arrangement change may be performed such that the first bytes W1B1 through W8B1 of the first through eighth data words W1 through W8 may be first provided to the memory module 340, and then the second bytes W1B2 through W8B2 through the eighth bytes W1B8 through W8B8 may be sequentially provided to the memory module 340. In the memory module 340 receiving the data on which the bit arrangement change is performed, the first through eighth memory devices 341 through 348 may store the first through eighth data words W1 through W8, respectively. Accordingly, in the processing mode, each processing device may read the full data word from the corresponding memory device 341 through 348, and may perform data processing on the full data word.

Figure 19:
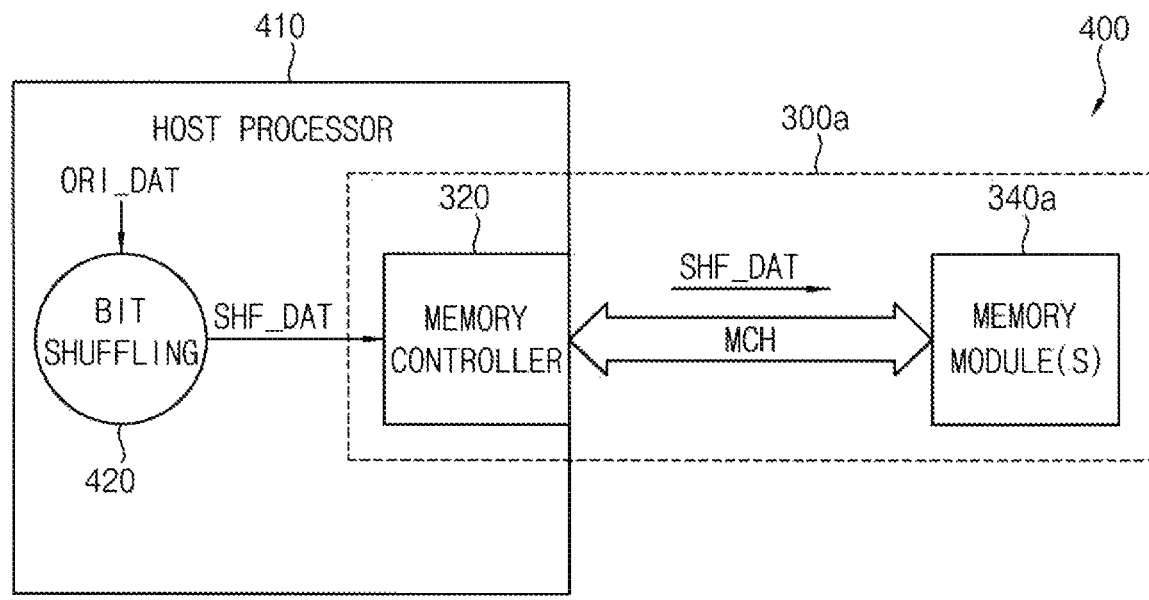
FIG. 19 is a block diagram illustrating a computing system including a host processor that performs a bit arrangement change, according to example embodiments.

FIG. 19 is a block diagram illustrating a computing system including a host processor that performs a bit arrangement change.

Referring to FIG. 19, a computing system 400 may include a host processor 410 and a memory system 300a. The host processor 410 may perform a bit arrangement change (as illustrated in FIG. 18) on original data 420 by performing a bit shuffling operation 420. In a normal mode, a memory controller 320 may provide the data SHF_DAT on which the bit arrangement change is performed to a memory module 340a through a memory channel MCH.

Figure 20:
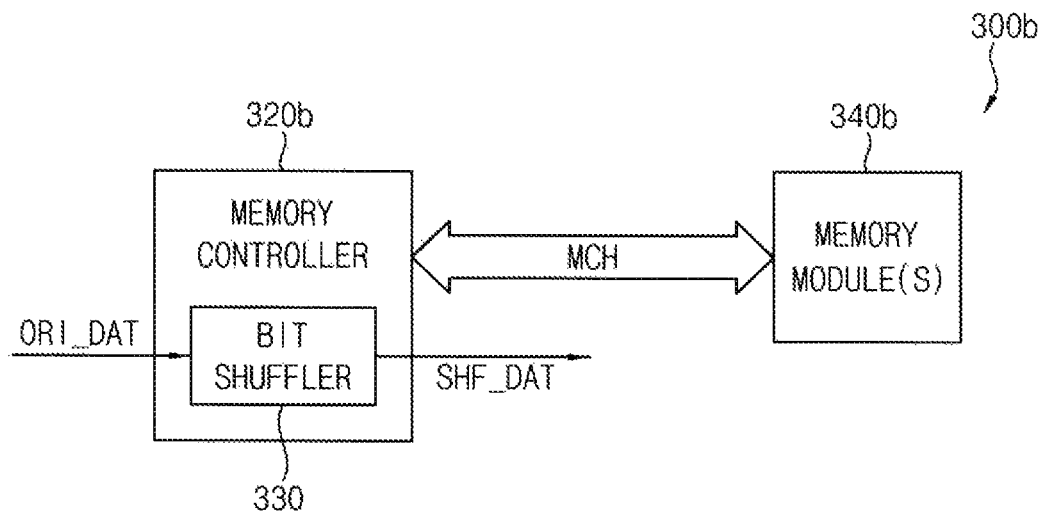
FIG. 20 is a block diagram illustrating a memory system including a bit shuffler that performs a bit arrangement change, according to example embodiments.

FIG. 20 is a block diagram illustrating a memory system including a bit shuffler that performs a bit arrangement change.

Referring to FIG. 20, a memory controller 320b of a memory system 300b may include a bit shuffler 330. The bit shuffler 330 may perform a bit arrangement change (as illustrated in FIG. 18) on original data ORI_DAT, and, in a normal mode, the memory controller 320b may provide the data SHF_DAT on which the bit arrangement change is performed to a memory module 340b through a memory channel MCH.

The embodiments discussed herein may be applied to any memory module and any memory system including the memory module.

Figure 21:
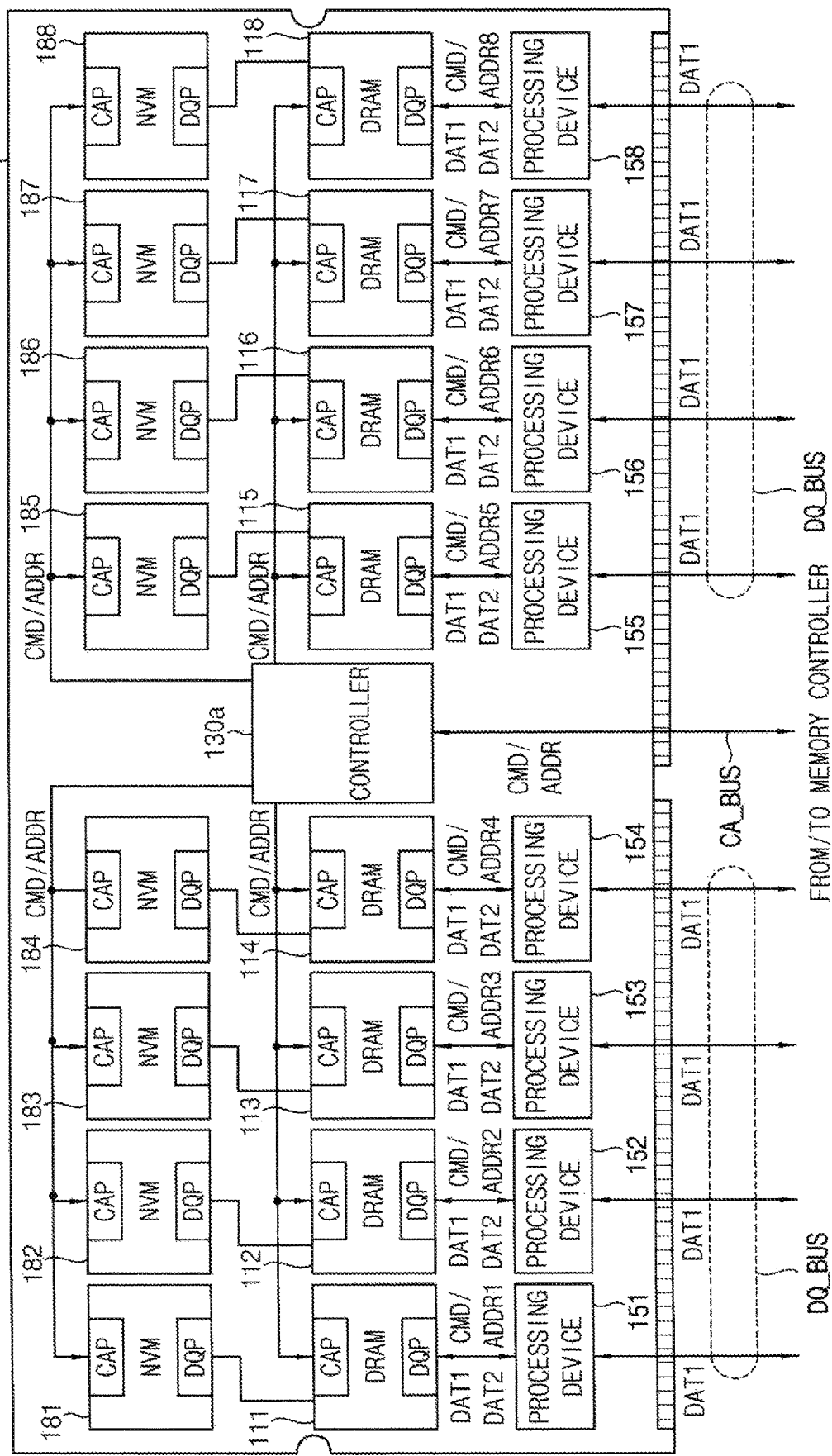
FIG. 21 is a diagram illustrating a non-volatile dual in-line memory module (NVDIMM) according to example embodiments.

FIG. 21 depicts an example of a non-volatile dual in-line memory module (NVDIMM) according to example embodiments.

As shown in FIG. 21, one example of an NVDIMM includes a module board 2100, a plurality of dynamic random access memory (DRAM) memory devices 111-118, a plurality of nonvolatile memory devices (NVM) 181-188 connected to the plurality of DRAM memory devices, an NVDIMM controller 130a, and a plurality of processing devices 151-158. Certain elements shown in FIG. 21 may be the same as other embodiments described previously, so those details will be omitted for brevity. Also, though FIG. 21 depicts a system similar to that shown in FIGS. 1A and 1B, a non-volatile dual in-line memory module may be implemented by adding non-volatile memory devices to the memory modules depicted in FIGS. 12, 13, 15, 16A, and 16B as well.

Each DRAM may include a memory cell array, and may have a structure and operation such as shown for example in FIG. 4 or 5. For example, each DRAM may include a first set of input/output terminals, such as CAP terminals. Each terminal may be configured to receive first command/address bits, for example from controller 130a. Each terminal may further include a second set of input/output terminals (e.g., DQP terminals), each terminal configured to receive first data bits. A plurality of nonvolatile memory devices 181-188, such as flash memory devices, or MRAM devices may be connected to the plurality of DRAM memory devices. For example, each nonvolatile memory device may include a memory cell array, a third set of input/output terminals (e.g., CAP), each terminal configured to receive second command/address bits (e.g., from controller 130a), and a fourth set of input/output terminals (e.g., DQP), each terminal configured to receive second data bits. For example, the second set of input/output terminals may be connected to data terminals of respective DRAM devices. The NVDIMM controller 130a may perform the functions of the Command/Address buffering device 130 described in the various previously-described embodiments, and may further perform functions for controlling the access to the nonvolatile memory devices. For example, among other things, the controller 130a may be configured to output the first command/address bits to the first set of input/output terminals and to output the second command/address bits to the third set of input/output terminals. A plurality of processing data buffers 151-158 may be connected to the plurality of DRAM memory devices respectively, each processing data buffer configured to switch between acting as a data buffer for its respective memory device and acting as a processor for performing processing operations on data received from its respective memory device, as discussed previously.

In some embodiments, a set of memory module terminals for connecting the memory module to an external device are positioned on one edge of the memory module, and the plurality of processing data buffers 151-158 are between the set of memory module terminals and the plurality of DRAM memory devices 111-118.

The controller may be positioned between a first subset of the DRAM memory devices (e.g., 111-114) and a second subset of the DRAM memory devices (e.g., 115-118). For example, there may be an equal number of DRAM memory devices (e.g., four) on either side of the controller.

As shown in FIG. 21, the plurality of DRAM memory devices 111-118 are between the plurality of processing data buffers 151-158 and the plurality of nonvolatile memory devices 181-188, respectively.

The plurality of processing data buffers 151-158 may include a fifth set of input/output terminals configured to transfer data bits and connected to a respective plurality of memory module terminals for communicating outside of the NVDIMM. For example, a set of input-output terminals may connect the processing data buffers 151-158 to their respective DRAMs 111-118, and another set of input-output terminals may connect the processing data buffers 151-158 to the data bus DQ_BUS through the memory module terminals.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of performing near data processing, comprising:
sending a processor mode entry command to a memory module instructing processing data buffers of the memory module to operate in processor mode during which the processing data buffers transmit first data to respective corresponding memory devices; and
sending a processor mode exit command to the memory module instructing the processing data buffers of the memory module to end operating in the processor mode and to operate in data buffer mode, during which the processing data buffers transmit second data to the respective corresponding memory devices,
wherein a clock speed used for transmitting the first data from each of the processing data buffers to a corresponding memory device during the processor mode is faster than a clock speed used for transmitting the second data from each of the processing data buffers to the corresponding memory device during the data buffer mode.

2. A method of performing near data processing, comprising:
receiving a first mode command at a processing data buffer of a memory module, the first mode command instructing the processing data buffer to operate in processor mode;
while operating in the processor mode, transmitting, from the processing data buffer, command and address information to a memory device to which the processing data buffer is connected;
receiving a second mode command at the processing data buffer, the second mode command instructing the processing data buffer to operate as a data buffer for the memory device in a data buffer mode; and
while operating in the data buffer mode, transmitting, from the processing data buffer, data to the memory device,
wherein a clock speed used for transmitting data from the processing data buffer to the memory device during the processor mode is faster than a clock speed used for transmitting data from the processing data buffer to the memory device during the data buffer mode.

3. The method of claim 2, wherein the first mode command is a mode entry command, and the second mode command is a mode exit command.

4. The method of claim 2, wherein:
both the data transmitted during the data buffer mode, and the command and address information transmitted during the processor mode are transmitted to the memory device over the same set of processing data buffer output terminals.

5. The method of claim 2, wherein:
the data transmitted during the data buffer mode is transmitted to the memory device over a first set of processing data buffer output terminals, and the command and address information transmitted during the processor mode is transmitted to the memory device over a second set of processing data buffer output terminals.

6. The method of claim 2, wherein the command and address information transmitted during the processor mode includes a memory device identifier.

7. The method of claim 2, further comprising, while operating in the processor mode:
transmitting the command and address information from the processing data buffer to the memory device at a first time; and
transmitting data from the processing data buffer to the to the memory device at a second time after the first time.

8. The method of claim 7, wherein after completing transmitting the command and address information from the processing data buffer to the memory device, there is a delay before transmitting the data from the processing data buffer to the to the memory device.

9. The method of claim 8, wherein during the delay, a selection circuit of the processing data buffer transitions between selecting a command/address path for incoming bits and selecting a data path for incoming bits.

\* \* \* \* \*